United States Patent
Ohta et al.

(10) Patent No.: US 7,995,186 B2
(45) Date of Patent: *Aug. 9, 2011

(54) SUBSTRATE CONVEYANCE DEVICE AND SUBSTRATE CONVEYANCE METHOD, EXPOSURE APPARATUS AND EXPOSURE METHOD, DEVICE MANUFACTURING METHOD

(75) Inventors: Atsushi Ohta, Shibata-gun (JP); Takashi Horiuchi, Kumagaya (JP)

(73) Assignees: Zao Nikon Co., Ltd., Katta-gun (JP); Nikon Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/652,015

(22) Filed: Jan. 11, 2007

(65) Prior Publication Data
US 2007/0110916 A1   May 17, 2007

Related U.S. Application Data

(60) Division of application No. 11/398,572, filed on Apr. 6, 2006, which is a continuation of application No. PCT/JP2004/014855, filed on Oct. 7, 2004.

(30) Foreign Application Priority Data

Oct. 8, 2003  (JP) .................. 2003-349550

(51) Int. Cl.
*G03B 27/52* (2006.01)
(52) U.S. Cl. ......................................... 355/30
(58) Field of Classification Search .............. 355/30, 355/53, 67, 71, 72, 75; 378/34, 35; 250/492.2
See application file for complete search history.

(56) References Cited

U.S. PATENT DOCUMENTS

| | | |
|---|---|---|
| 3,727,620 A | 4/1973 | Orr |
| 4,346,164 A | 8/1982 | Tabarelli et al. |
| 4,465,368 A | 8/1984 | Matsuura et al. |
| 4,480,910 A | 11/1984 | Takanashi et al. |
| 5,177,528 A | 1/1993 | Koromegawa et al. |
| 5,274,434 A | 12/1993 | Morioka et al. |
| 5,444,529 A | 8/1995 | Tateiwa |
| 5,493,403 A | 2/1996 | Nishi |

(Continued)

FOREIGN PATENT DOCUMENTS
DE   221 563 A1   4/1985

(Continued)

OTHER PUBLICATIONS
U.S. Appl. No. 10/587,268.

(Continued)

*Primary Examiner* — Hung Henry Nguyen
*Assistant Examiner* — Steven H Whitesell-Gordon
(74) *Attorney, Agent, or Firm* — Oliff & Berridge, PLC

(57) ABSTRACT

A lithographic projection apparatus includes a substrate table configured to hold a substrate, a projection system arranged to project a patterned beam of radiation onto the substrate, a liquid supply system configured to supply liquid to a space between the projection system and the substrate, and a residual liquid detector configured to detect liquid remaining on the substrate and/or the substrate table after an exposure is completed. A device manufacturing method includes projecting, using a projection system of a lithographic apparatus, a patterned beam of radiation through a liquid onto a substrate, the substrate being held by a substrate table, and, after the projecting is complete, detecting residual liquid on the substrate and/or the substrate table.

17 Claims, 8 Drawing Sheets

U.S. PATENT DOCUMENTS

| | | |
|---|---|---|
| 5,528,118 A | 6/1996 | Lee |
| 5,610,683 A | 3/1997 | Takahashi |
| 5,623,853 A | 4/1997 | Novak et al. |
| 5,646,413 A | 7/1997 | Nishi |
| 5,684,296 A * | 11/1997 | Hamblin et al. ......... 250/227.11 |
| 5,715,039 A | 2/1998 | Fukuda et al. |
| 5,825,043 A | 10/1998 | Suwa |
| 5,874,820 A | 2/1999 | Lee |
| 5,969,441 A | 10/1999 | Loopstra et al. |
| 6,012,966 A | 1/2000 | Ban et al. |
| 6,025,206 A | 2/2000 | Chen et al. |
| 6,195,154 B1 | 2/2001 | Imai |
| 6,208,407 B1 | 3/2001 | Loopstra |
| 6,281,962 B1 | 8/2001 | Ogata et al. |
| 6,341,007 B1 | 1/2002 | Nishi et al. |
| 6,400,441 B1 | 6/2002 | Nishi et al. |
| 6,538,823 B2 | 3/2003 | Kroupenkine et al. |
| 6,549,269 B1 | 4/2003 | Nishi et al. |
| 6,590,634 B1 | 7/2003 | Nishi et al. |
| 6,827,816 B1 | 12/2004 | Uziel et al. |
| 7,070,915 B2 | 7/2006 | Ho et al. |
| 2001/0055100 A1 | 12/2001 | Murakami |
| 2002/0041377 A1 | 4/2002 | Hagiwara et al. |
| 2002/0061469 A1 | 5/2002 | Tanaka |
| 2002/0163629 A1 | 11/2002 | Switkes et al. |
| 2003/0013026 A1 | 1/2003 | Lim |
| 2003/0030916 A1 | 2/2003 | Suenaga |
| 2003/0174408 A1 | 9/2003 | Rostalski et al. |
| 2004/0000627 A1 | 1/2004 | Schuster |
| 2004/0020782 A1 | 2/2004 | Cohen et al. |
| 2004/0075895 A1 | 4/2004 | Lin |
| 2004/0103950 A1 | 6/2004 | Iriguchi |
| 2004/0109237 A1 | 6/2004 | Epple et al. |
| 2004/0114117 A1 | 6/2004 | Bleeker |
| 2004/0118184 A1 | 6/2004 | Violette |
| 2004/0119954 A1 | 6/2004 | Kawashima et al. |
| 2004/0125351 A1 | 7/2004 | Krautschik |
| 2004/0136494 A1 | 7/2004 | Lof et al. |
| 2004/0160582 A1 | 8/2004 | Lof et al. |
| 2004/0165159 A1 | 8/2004 | Lof et al. |
| 2004/0169834 A1 | 9/2004 | Richter et al. |
| 2004/0169924 A1 | 9/2004 | Flagello et al. |
| 2004/0180294 A1 | 9/2004 | Baba-Ali et al. |
| 2004/0180299 A1 | 9/2004 | Rolland et al. |
| 2004/0207824 A1 | 10/2004 | Lof et al. |
| 2004/0211920 A1 | 10/2004 | Maria Derksen et al. |
| 2004/0224265 A1 | 11/2004 | Endo et al. |
| 2004/0224525 A1 | 11/2004 | Endo et al. |
| 2004/0227923 A1 | 11/2004 | Flagello et al. |
| 2004/0233405 A1 | 11/2004 | Kato et al. |
| 2004/0253547 A1 | 12/2004 | Endo et al. |
| 2004/0253548 A1 | 12/2004 | Endo et al. |
| 2004/0257544 A1 | 12/2004 | Vogel et al. |
| 2004/0259008 A1 | 12/2004 | Endo et al. |
| 2004/0259040 A1 | 12/2004 | Endo et al. |
| 2004/0263808 A1 | 12/2004 | Sewell |
| 2004/0263809 A1 | 12/2004 | Nakano |
| 2005/0002004 A1 | 1/2005 | Kolesnychenko et al. |
| 2005/0007569 A1 | 1/2005 | Streefkerk et al. |
| 2005/0007570 A1 | 1/2005 | Streefkerk et al. |
| 2005/0018155 A1 | 1/2005 | Cox et al. |
| 2005/0018156 A1 | 1/2005 | Mulkens et al. |
| 2005/0024609 A1 | 2/2005 | De Smit et al. |
| 2005/0030497 A1 | 2/2005 | Nakamura |
| 2005/0030498 A1 | 2/2005 | Mulkens |
| 2005/0030506 A1 | 2/2005 | Schuster |
| 2005/0030511 A1 | 2/2005 | Auer-Jongepier et al. |
| 2005/0036121 A1 | 2/2005 | Hoogendam et al. |
| 2005/0036183 A1 | 2/2005 | Yeo et al. |
| 2005/0036184 A1 | 2/2005 | Yeo et al. |
| 2005/0036213 A1 | 2/2005 | Mann et al. |
| 2005/0037269 A1 | 2/2005 | Levinson |
| 2005/0041225 A1 | 2/2005 | Sengers et al. |
| 2005/0042554 A1 | 2/2005 | Dierichs et al. |
| 2005/0046813 A1 | 3/2005 | Streefkerk et al. |
| 2005/0046934 A1 * | 3/2005 | Ho et al. .................. 359/380 |
| 2005/0048220 A1 | 3/2005 | Mertens et al. |
| 2005/0048223 A1 | 3/2005 | Pawloski et al. |
| 2005/0052632 A1 | 3/2005 | Miyajima |
| 2005/0068639 A1 | 3/2005 | Pierrat et al. |
| 2005/0073670 A1 | 4/2005 | Carroll |
| 2005/0074704 A1 | 4/2005 | Endo et al. |
| 2005/0078286 A1 | 4/2005 | Dierichs et al. |
| 2005/0078287 A1 | 4/2005 | Sengers et al. |
| 2005/0084794 A1 | 4/2005 | Meagley et al. |
| 2005/0088635 A1 | 4/2005 | Hoogendam et al. |
| 2005/0094114 A1 | 5/2005 | Streefkerk et al. |
| 2005/0094116 A1 | 5/2005 | Flagello et al. |
| 2005/0094119 A1 | 5/2005 | Loopstra et al. |
| 2005/0100745 A1 | 5/2005 | Lin et al. |
| 2005/0110973 A1 | 5/2005 | Streefkerk et al. |
| 2005/0117224 A1 | 6/2005 | Shafer et al. |
| 2005/0122497 A1 | 6/2005 | Lyons et al. |
| 2005/0132914 A1 | 6/2005 | Mulkens et al. |
| 2005/0134815 A1 | 6/2005 | Van Santen et al. |
| 2005/0134817 A1 | 6/2005 | Nakamura |
| 2005/0141098 A1 | 6/2005 | Schuster |
| 2005/0145265 A1 | 7/2005 | Ravkin et al. |
| 2005/0145803 A1 | 7/2005 | Hakey et al. |
| 2005/0146694 A1 | 7/2005 | Tokita |
| 2005/0146695 A1 | 7/2005 | Kawakami |
| 2005/0147920 A1 | 7/2005 | Lin et al. |
| 2005/0153424 A1 | 7/2005 | Coon |
| 2005/0158673 A1 | 7/2005 | Hakey et al. |
| 2005/0161644 A1 | 7/2005 | Zhang et al. |
| 2005/0164502 A1 | 7/2005 | Deng et al. |
| 2005/0173682 A1 | 8/2005 | Zhang et al. |
| 2005/0174549 A1 | 8/2005 | Duineveld et al. |
| 2005/0175940 A1 | 8/2005 | Dierichs |
| 2005/0185269 A1 | 8/2005 | Epple et al. |
| 2005/0190435 A1 | 9/2005 | Shafer et al. |
| 2005/0190455 A1 | 9/2005 | Rostalski et al. |
| 2005/0205108 A1 | 9/2005 | Chang et al. |
| 2005/0213061 A1 | 9/2005 | Hakey et al. |
| 2005/0213072 A1 | 9/2005 | Schenker et al. |
| 2005/0217135 A1 | 10/2005 | O'Donnell et al. |
| 2005/0217137 A1 | 10/2005 | Smith et al. |
| 2005/0217703 A1 | 10/2005 | O'Donnell |
| 2005/0219481 A1 | 10/2005 | Cox et al. |
| 2005/0219482 A1 | 10/2005 | Baselmans et al. |
| 2005/0219499 A1 | 10/2005 | Maria Zaal et al. |
| 2005/0225734 A1 | 10/2005 | De Smit et al. |
| 2005/0225735 A1 | 10/2005 | Magome et al. |
| 2005/0225737 A1 | 10/2005 | Weissenrieder et al. |
| 2005/0231694 A1 | 10/2005 | Kolesnychenko et al. |
| 2005/0233081 A1 | 10/2005 | Tokita |
| 2005/0237501 A1 | 10/2005 | Furukawa et al. |
| 2005/0243292 A1 | 11/2005 | Baselmans et al. |
| 2005/0245005 A1 | 11/2005 | Benson |
| 2005/0253090 A1 | 11/2005 | Gau et al. |
| 2005/0259232 A1 | 11/2005 | Streefkerk et al. |
| 2005/0259233 A1 | 11/2005 | Streefkerk et al. |
| 2005/0259236 A1 | 11/2005 | Straaijer |
| 2005/0264774 A1 | 12/2005 | Mizutani et al. |
| 2005/0264778 A1 | 12/2005 | Lof et al. |
| 2005/0270505 A1 | 12/2005 | Smith |
| 2006/0007419 A1 | 1/2006 | Streefkerk et al. |
| 2006/0077367 A1 | 4/2006 | Kobayashi et al. |
| 2006/0098177 A1 | 5/2006 | Nagasaka |
| 2006/0119813 A1 | 6/2006 | Hultermans et al. |
| 2006/0132737 A1 | 6/2006 | Magome et al. |
| 2006/0177777 A1 | 8/2006 | Kawamura et al. |
| 2006/0256316 A1 | 11/2006 | Tanno et al. |
| 2006/0257553 A1 | 11/2006 | Ohta et al. |
| 2007/0159609 A1 | 7/2007 | Takaiwa et al. |

FOREIGN PATENT DOCUMENTS

| | | |
|---|---|---|
| DE | 224 448 A1 | 7/1985 |
| EP | 0 605 103 A1 | 7/1994 |
| EP | 1 557 721 A2 | 7/2005 |
| EP | 1 571 694 A1 | 9/2005 |
| EP | 1 571 699 A1 | 9/2005 |
| EP | 1 628 329 A1 | 2/2006 |
| EP | 1 632 991 A1 | 3/2006 |
| EP | 1 653 501 A1 | 5/2006 |
| EP | 1 672 681 A1 | 6/2006 |
| JP | A-57-117238 | 7/1982 |

| | | |
|---|---|---|
| JP | A-57-153433 | 9/1982 |
| JP | A 57-153433 | 9/1982 |
| JP | A-58-202448 | 11/1983 |
| JP | A 58-202448 | 11/1983 |
| JP | A 59-019912 | 2/1984 |
| JP | A-59-19912 | 2/1984 |
| JP | A-6-124873 | 5/1984 |
| JP | A-62-65326 | 3/1987 |
| JP | A 62-065326 | 3/1987 |
| JP | 6373628 * | 4/1988 |
| JP | A 63-73628 | 4/1988 |
| JP | A-63-73628 | 4/1988 |
| JP | A-63-157419 | 6/1988 |
| JP | A 63-157419 | 6/1988 |
| JP | A-4-65603 | 3/1992 |
| JP | A-4-305915 | 10/1992 |
| JP | A 04-305915 | 10/1992 |
| JP | A 04-305917 | 10/1992 |
| JP | A-4-305917 | 10/1992 |
| JP | A 05-062877 | 3/1993 |
| JP | A-5-62877 | 3/1993 |
| JP | A-6-53120 | 2/1994 |
| JP | A 6-124873 | 5/1994 |
| JP | A-6-124873 | 5/1994 |
| JP | A 6-168866 | 6/1994 |
| JP | A-6-168866 | 6/1994 |
| JP | A-6-188169 | 7/1994 |
| JP | A-7-176468 | 7/1995 |
| JP | A 07-220990 | 8/1995 |
| JP | A-7-220990 | 8/1995 |
| JP | A-8-37149 | 2/1996 |
| JP | A 08-166475 | 6/1996 |
| JP | A 08-316125 | 11/1996 |
| JP | A-8-316125 | 11/1996 |
| JP | A 08-330224 | 12/1996 |
| JP | A-10-163099 | 6/1998 |
| JP | A-10-214783 | 8/1998 |
| JP | A-10-303114 | 11/1998 |
| JP | A 10-303114 | 11/1998 |
| JP | A 10-340846 | 12/1998 |
| JP | A-10-340846 | 12/1998 |
| JP | A-11-16816 | 1/1999 |
| JP | A-11-135400 | 5/1999 |
| JP | A 11-176727 | 7/1999 |
| JP | A-11-176727 | 7/1999 |
| JP | A 2000-058436 | 2/2000 |
| JP | A-2000-58436 | 2/2000 |
| JP | A-2000-505958 | 5/2000 |
| JP | A-2000-155079 | 6/2000 |
| JP | A-2000-180371 | 6/2000 |
| JP | A-2002-14005 | 1/2002 |
| JP | A-2003-7669 | 1/2003 |
| JP | A-2004-207696 | 7/2004 |
| JP | A-2005-5713 | 1/2005 |
| JP | A-2005-12195 | 1/2005 |
| JP | A-2005-57278 | 3/2005 |
| JP | A-2005-252239 | 9/2005 |
| WO | WO 98/28665 | 7/1998 |
| WO | WO 99/49504 | 9/1999 |
| WO | WO 02/091078 A1 | 11/2002 |
| WO | WO 03/077037 A1 | 9/2003 |
| WO | WO 2004/019128 A2 | 3/2004 |
| WO | WO 2004/053952 | 6/2004 |
| WO | WO 2004/053952 A1 | 6/2004 |
| WO | WO 2004/053958 A1 | 6/2004 |
| WO | WO 2004/055803 A1 | 7/2004 |
| WO | WO 2004/057589 A1 | 7/2004 |
| WO | WO 2004/057590 A1 | 7/2004 |
| WO | WO 2004/077154 A2 | 9/2004 |
| WO | WO 2004/081666 A1 | 9/2004 |
| WO | WO 2004/090577 A2 | 10/2004 |
| WO | WO 2004/090633 A2 | 10/2004 |
| WO | WO 2004/090634 A2 | 10/2004 |
| WO | WO 2004/092830 A2 | 10/2004 |
| WO | WO 2004/092833 A2 | 10/2004 |
| WO | WO 2004/093130 A2 | 10/2004 |
| WO | WO 2004/093159 A2 | 10/2004 |
| WO | WO 2004/093160 A2 | 10/2004 |
| WO | WO 2004/095135 A2 | 11/2004 |
| WO | WO 2004/105106 A1 | 12/2004 |
| WO | WO 2004/105107 A1 | 12/2004 |
| WO | WO 2005/001432 A2 | 1/2005 |
| WO | WO 2005/001572 A2 | 1/2005 |
| WO | WO 2005/003864 A2 | 1/2005 |
| WO | WO 2005/006026 A2 | 1/2005 |
| WO | WO 2005/008339 A2 | 1/2005 |
| WO | WO 2005/010962 A1 | 2/2005 |
| WO | WO 2005/013008 A2 | 2/2005 |
| WO | WO 2005/015283 A1 | 2/2005 |
| WO | WO 2005/017625 A2 | 2/2005 |
| WO | WO 2005/019935 A2 | 3/2005 |
| WO | WO 2005/022266 A2 | 3/2005 |
| WO | WO 2005/024325 A2 | 3/2005 |
| WO | WO 2005/024517 A2 | 3/2005 |
| WO | WO 2005/034174 A2 | 4/2005 |
| WO | WO 2005/036621 A1 | 4/2005 |
| WO | WO 2005/050324 A2 | 6/2005 |
| WO | WO 2005/054953 A2 | 6/2005 |
| WO | WO 2005/054955 A2 | 6/2005 |
| WO | WO 2005/059617 A2 | 6/2005 |
| WO | WO 2005/059618 A2 | 6/2005 |
| WO | WO 2005/059645 A2 | 6/2005 |
| WO | WO 2005/059654 A1 | 6/2005 |
| WO | WO 2005/062128 A2 | 7/2005 |
| WO | WO 2005/064400 A2 | 7/2005 |
| WO | WO 2005/064405 A2 | 7/2005 |
| WO | WO 2005/069055 A2 | 7/2005 |
| WO | WO 2005/069078 A1 | 7/2005 |
| WO | WO 2005/069081 A1 | 7/2005 |
| WO | WO 2005/071491 A2 | 8/2005 |
| WO | WO 2005/074606 A2 | 8/2005 |
| WO | WO 2005/076084 A1 | 8/2005 |
| WO | WO 2005/076321 A1 | 8/2005 |
| WO | WO 2005/081030 A1 | 9/2005 |
| WO | WO 2005/081067 A1 | 9/2005 |
| WO | WO 2005/098504 A1 | 10/2005 |
| WO | WO 2005/098505 A1 | 10/2005 |
| WO | WO 2005/098506 A1 | 10/2005 |
| WO | WO 2005/106589 A1 | 11/2005 |
| WO | WO 2005/111689 A2 | 11/2005 |
| WO | WO 2005/111722 A2 | 11/2005 |
| WO | WO 2005/119368 A2 | 12/2005 |
| WO | WO 2005/119369 A1 | 12/2005 |

OTHER PUBLICATIONS

B.J. Lin, "Semiconductor Foundry, Lithography, and Partners," Proceedings of SPEI, vol. 4688, 2002, pp. 11-24.
M. Switkes, et al., "Resolution Enhancement of 157 nm Lithography by Liquid Immersion," Proceedings of SPEI, vol. 4691, 2002, pp. 459-465.
M. Switkes, et al., "Resolution Enhancement of 157 nm Lithography by Liquid Immersion," J. Microlith., Microfab., Microsyst., vol. 1, No. 3, Oct. 2002, pp. 1-4.
Soich Owa et al., "Nikon F2 Exposure Tool," $3^{rd}$ 157nm symposium 2002, Sep. 4, 2002, slides 1-25.
Soich Owa, "Immersion Lithography," Imersion Lithography Workshop, Dec. 11, 2002, slides 1-24.
Soich Owa et al., "Immersion lithography; its potential performance and issues," Optical Microlithography XVI, Proceedings of SPIE, vol. 5040, 2003, pp. 724-733.
Soich Owa et al., "Potential performance and feasibility of immersion lithography," NGL Workshop 2003, Jul. 10, 2003, slides 1-33.
S. Owa et al.,"Update on 193nm immersion exposure tool," Immersion Workshop 2004, Jan. 27, 2004, slides 1-38.
S. Owa et al., "Update on 193nm immersion exposure tool," Litho Forum, Jan. 28, 2004, slides 1-51.
European Search Report for Patent Application No. 04792152.3; mailed Apr. 2, 2008.
Office Action for European Patent Application No. 04792152.3; mailed Jul. 18, 2008.
Office Action for European Patent Application 04792152.3; mailed Feb. 17, 2009.
International Search Report and Written Opinion for International Application No. PCT/JP2004/014855; mailed Jan. 11, 2005; with translation.

Office Action for Patent Application No. 2005-514600; mailed Nov. 25, 2008; with translation.
Office Action for Patent Application No. 2005-514600; mailed May 19, 2009; with translation.
Nov. 18, 2009 Office Action issued in U.S. Appl. No. 11/398,572.
Aug. 27, 2009 Office Action issued in U.S. Appl. No. 11/398,572.
Nov. 28, 2008 Office Action issued in U.S. Appl. No. 11/398,572.
Mar. 4. 2008 Office Action issued in U.S. Appl. No. 11/398,572.
Dec. 27, 2009 Office Action issued in U.S. Appl. No. 11/889,288.
Jun. 25, 2008 Office Action in U.S. Appl. No. 10/587,268.
Feb. 20, 2009 Office Action in U.S. Appl. No. 10/587,268.
Sep. 29, 2009 Office Action in U.S. Appl. No. 10/587,268.
Mar. 5, 2010 Office Action in U.S. Appl. No. 10/587,268.
Sep. 9, 2010 Notice of Allowance in U.S. Appl. No. 10/587,268.
Jun. 25, 2008 Office Action in U.S. Appl. No. 11/651,551.
Feb. 12, 2009 Office Action in U.S. Appl. No. 11/651,551.
Sep. 30, 2009 Office Action in U.S. Appl. No. 11/651,551.
Mar. 5, 2010 Office Action in U.S. Appl. No. 11/651,551.
Nov. 3, 2010 Notice of Allowance in U.S. Appl. No. 11/651,551.
Aug. 20, 2010 Supplementary European Search Report in European Application No. 05709451.8.
May 31, 2005 International Search Report in International Application No. PCT/JP2005/001225, with translation.
Mary 31, 2005 Written Opinion in International Application No. PCT/JP2005/001225, with translation.
Dec. 8, 2009 Office Action in Japanese Application No. 2005-517658, with translation.
Apr. 6, 2010 Notice of Allowance in Japanese Application No. 2005-517658, with translation.
Office Action from U.S. Appl. No. 11/398,572; mailed Jul. 28, 2010.
Office Action from U.S. Appl. No. 11/889,288; mailed Jul. 28, 2010.
U.S. Appl. No. 10/587,268, filed Jul. 26, 2006.
Feb. 16, 2011 Office Action issued in U.S. Appl. No. 11/398,572.
Oct. 28, 2010 Office Action issued in counterpart Application No. 04792152.3.
Dec. 7, 2009 Office Action issued in U.S. Appl. No. 11/889,288.
Mar. 11, 2011 Office Action issued in Korean Patent Application No. 10-2006-7006650 (with translation).
Apr. 5, 2011 Office Action issued in Japanese Patent Application No, 2009-013518 (with translation).
Apr. 26, 2011 Office Action issued in Korean Patent Application No. 10-2006-7011212 (with translation).
Apr. 27, 2011 Office Action issued in U.S. Appl. No. 11/889,288.

\* cited by examiner

SUBSTRATE CONVEYANCE DEVICE AND SUBSTRATE CONVEYANCE METHOD, EXPOSURE APPARATUS AND EXPOSURE METHOD, DEVICE MANUFACTURING METHOD

CROSS-REFERENCE TO RELATED APPLICATIONS

This is a Divisional of U.S. patent application Ser. No. 11/398,572 filed Apr. 6, 2006, which is a Continuation of International Application No. PCT/JP2004/014855 filed Oct. 7, 2004, which claims priority to 2003-349550. The contents of each of the aforementioned applications are incorporated herein by reference in their entireties.

BACKGROUND OF THE INVENTION

1. Field of the Invention

The present invention relates to a substrate conveyance device and a substrate conveyance method that conveys a substrate exposed by a liquid immersion method, to an exposure apparatus and an exposure method, and to a device manufacturing method.

The present application claims priority to Japanese Patent Application No. 2003-349550, filed on Oct. 8, 2003, and the content thereof is incorporated herein by reference.

2. Description of Related Art

Semiconductor devices and liquid crystal display devices are manufactured through the so-called photolithography technique, by which a pattern formed on a mask is transferred onto a photosensitive substrate. The exposure apparatus used in the photolithography process has a mask stage that supports a mask and a substrate stage that supports a substrate, and while successively moving the mask stage and the substrate stage, transfers the mask pattern, via a projection optical system, onto the substrate. In recent years, to address the increasingly high integration of device patterns, increasingly high resolution of the projection optical system has been desired. The shorter the exposure wavelength used is, and, also, the larger the numerical aperture of the projection optical system is, the higher the resolution of the projection optical system becomes. For this reason, the exposure wavelength used for the exposure apparatus is becoming shorter and shorter year by year, and the numerical aperture of the projection optical system is also becoming larger and larger. In this context, the presently dominant exposure wavelength is 248 nm from a KrF excimer laser, but a still shorter wavelength of 193 nm from an ArF excimer laser is now gradually being put to practical use. In addition, when performing exposure, the depth of focus (DOF) is an important factor as well as the resolution. The resolution R and the depth of focus δ are respectively expressed by the following formulas:

$$R = k_1 \cdot \lambda / NA, \quad (1)$$

$$\delta = \pm k_2 \cdot \lambda / NA^2, \quad (2)$$

where λ is the exposure wavelength, NA is the numerical aperture of the projection optical system, and $k_1$ and $k_2$ are process coefficients. It can be seen from formulas (1) and (2) that if, to enhance the resolution R, the wavelength λ is made shorter and the numerical aperture is made larger, then the depth of focus δ becomes narrower.

When the depth of focus δ becomes too narrow, it becomes difficult to make the substrate surface coincide with the image plane of the projection optical system, and thus there occurs the possibility that the focus margin during the exposure operation will be insufficient. To address this problem, the liquid immersion method, which is disclosed in, e.g., PCT International Publication WO 99/49504 mentioned below, has been proposed as a method to make the exposure wavelength shorter in effect and to make the depth of focus broader. This liquid immersion method is designed to, by filling the space between the under surface of the projection optical system and the substrate surface with a liquid, e.g., water or organic solvent and thus by taking advantage of the fact that the wavelength of the exposure light in the liquid becomes 1/n times (n is the refractive index of the liquid and is generally about 1.2 to 1.6) of that in the air, improve the resolution and, at the same time, enlarge the depth of focus by approximately n times.

By the way, when a liquid remains on a substrate having been liquid immersion exposed, various disadvantages may arise. For example, when a substrate on which a liquid still adheres is subjected to a development process, development irregularity is induced; or an adhesion trace (the so-called water mark) that remains on the substrate after the remaining liquid has vaporized induces a development irregularity. As just described, when the liquid remaining on a substrate having been liquid immersion exposed is left as it is, a device defect is induced; however, such a defect is found as a form of a defective product only after completing a final device, which may cause decrease of device productivity.

The present invention has been made in consideration of such situations, and it is directed to a substrate conveyance device and a substrate conveyance method, an exposure apparatus and an exposure method, and a device manufacturing method that are capable of preventing the defective device due to a liquid remaining on a substrate having been liquid immersion exposed.

A substrate conveyance device of the present invention is a substrate conveyance device that conveys a substrate having been exposed with a pattern image via a projection optical system and a liquid, the substrate conveyance device comprising: a liquid detector that detects the liquid adhering on the substrate.

Further, a substrate conveyance method of the present invention is a substrate conveyance method in which a substrate having been exposed with a pattern image via a projection optical system and a liquid is conveyed, the substrate conveyance method comprising: detecting the liquid adhering on the substrate on the conveyance path of the substrate.

According to the present invention, the liquid adhering on the substrate can be detected when the substrate experienced the liquid immersion exposure is conveyed. Further, based on the detection results, in the case, for example, where the liquid is adhering on the substrate, the substrate can be, after removing the liquid therefrom, sent to a post-exposure process, e.g., a development process. Thus, a device having a desired performance can be produced without being affected by the liquid in the post-exposure process. Further, when it is detected that the liquid is not adhering on the substrate, the liquid removal process can be omitted, which improves the operation efficiency. In addition, by executing again the liquid detection process on the substrate after the liquid removal process, it can be detected whether the liquid removal has been performed well. In this way, based on the detection results from the liquid detector, appropriate steps to maintain high device productivity can be taken.

An exposure apparatus of the present invention is an exposure apparatus which exposes a substrate by projecting a pattern image, via a projection optical system and a liquid, onto the substrate held by a substrate stage, comprising: conveying the substrate from the substrate stage by use of the substrate conveyance device.

Further, an exposure method of the present invention is an exposure method in which a substrate is exposed by projecting a pattern image, via a projection optical system and a liquid, onto the substrate held by a substrate stage, wherein the substrate is conveyed from the substrate stage by use of the substrate conveyance method.

Further, a device manufacturing method of the present invention uses the exposure method.

In accordance with the present invention, based on the detection results from the liquid detector, appropriate steps to maintain high device productivity can be taken, and thus a device having a desired performance can be produced.

BRIEF DESCRIPTION OF THE DRAWINGS

FIG. 1 is viewed from above.

BEST MODE FOR CARRYING OUT THE INVENTION

Figure 1:
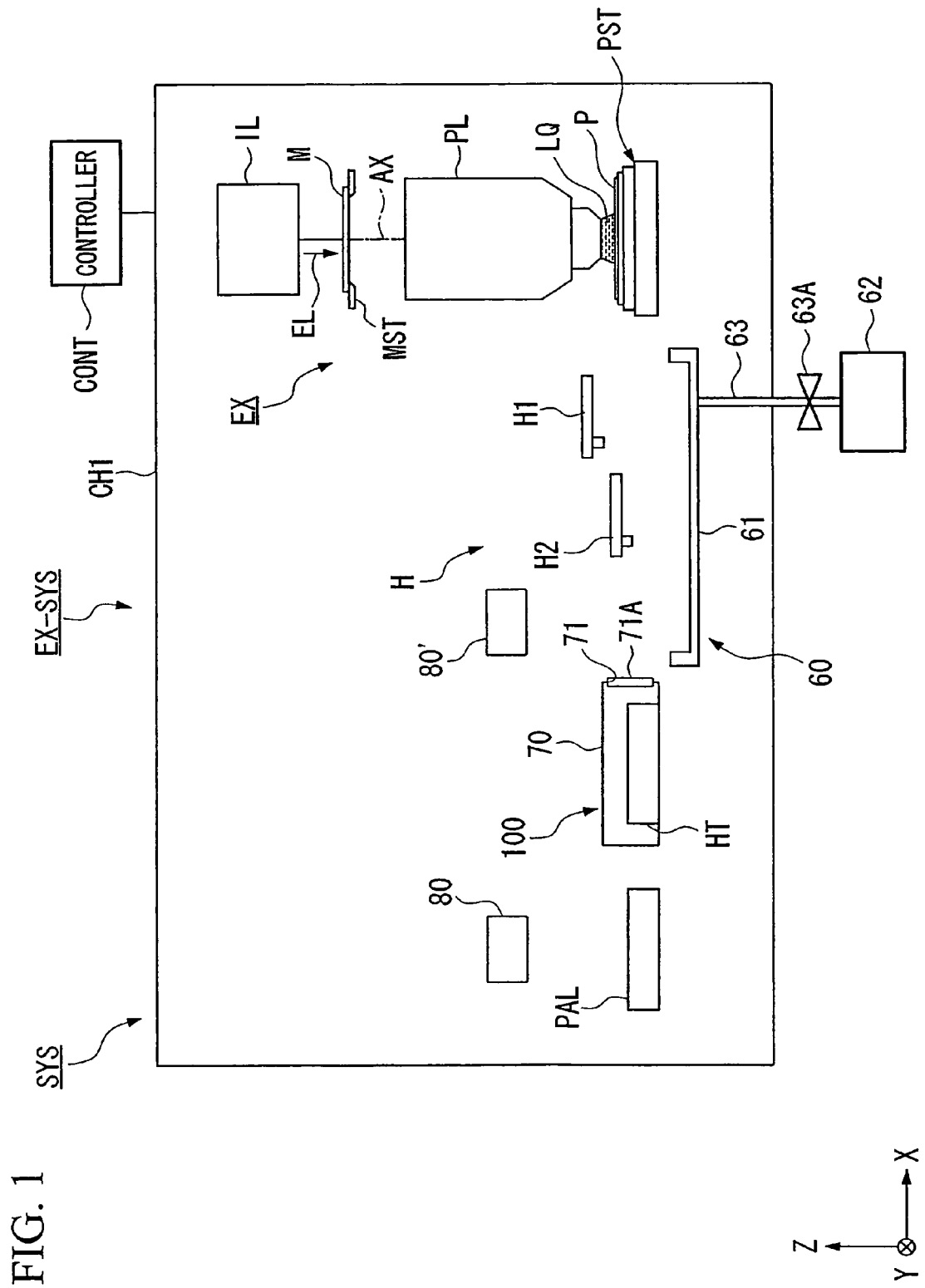
FIG. 1 is a schematic diagram showing an embodiment of a device manufacturing system as an exposure apparatus of the present invention.
Figure 2:
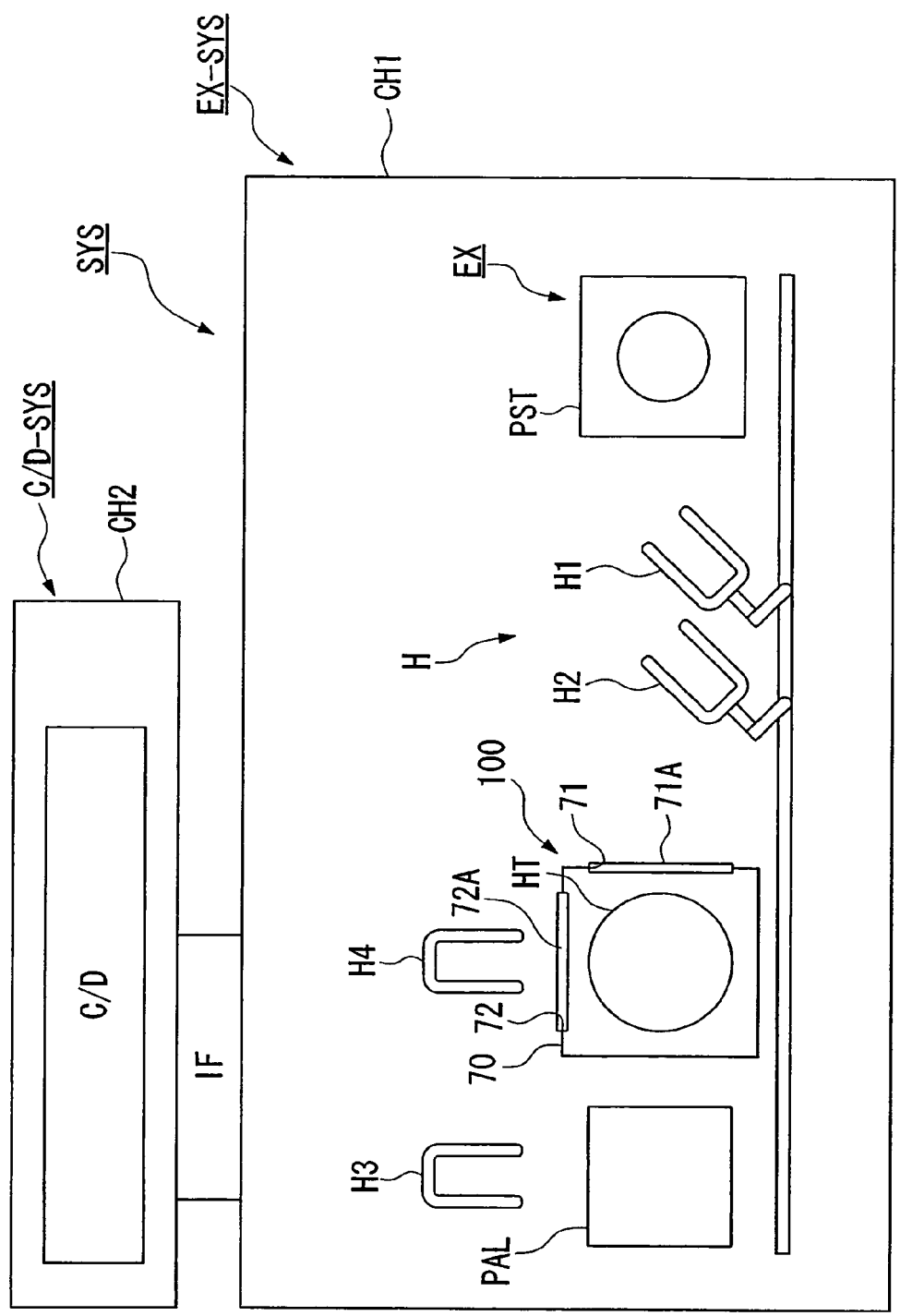
FIG. 2 is a diagram when
Figure 2:
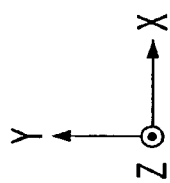

In the following, referring to the drawings, a substrate conveyance device and an exposure apparatus of the present invention will be described. FIG. 1 is a diagram showing an embodiment of a device manufacturing system provided with an exposure apparatus of the present invention and is a schematic diagram when viewed from the side; FIG. 2 is a diagram when FIG. 1 is viewed from above.

In FIGS. 1 and 2, device manufacturing system SYS is provided with exposure apparatus EX-SYS and coater-developer apparatus C/D-SYS (see FIG. 2). Exposure apparatus EX-SYS is provided with interface portion IF (see FIG. 2) that forms a connection portion thereof to coater-developer apparatus C/D-SYS, with exposure apparatus main body EX that by filling a space between projection optical system PL and substrate P with liquid LQ and by projecting a pattern formed on a mask onto substrate P via projection optical system PL and liquid LQ, exposes substrate P, with conveyance system H that conveys substrate P between interface portion IF and exposure apparatus main body EX, with liquid removal system 100 that is provided on the conveyance path of conveyance system H and removes liquid LQ adhering on the surface of substrate P, with imaging device 80 that constitutes a liquid detector which is provided on the conveyance path of conveyance system H and detects liquid LQ adhering on substrate P, and with controller CONT that controls the overall operation of exposure apparatus EX-SYS. Coater-developer apparatus C/D-SYS is provided with coater apparatus C that applies photoresist (photosensitive material) to the base material of substrate P before it experiences an exposure process and with development apparatus (processing apparatus) D that develops substrate P after it experienced an exposure process at exposure apparatus main body EX. Exposure apparatus main body EX is located within first chamber apparatus CH1 of which cleanliness is controlled. First chamber apparatus CH1 that accommodates exposure apparatus main body EX and second chamber apparatus CH2 that accommodates coater apparatus C and development apparatus D are connected to each other via interface portion IF. Note that in the following description, coater apparatus C and development apparatus D that are accommodated in second chamber apparatus CH2 will be collectively referred to as "coater-developer main body C/D" as necessary.

As shown in FIG. 1, exposure apparatus main body EX is provided with illumination optical system IL that illuminates mask M supported by mask stage MST with exposure light EL, with projection optical system PL that projects an image of a pattern of mask M illuminated with exposure light EL onto substrate P, and with substrate stage PST that supports substrate P. Further, exposure apparatus main body EX of the embodiment is a scan type exposure apparatus (the so-called scanning stepper) in which while synchronously moving mask M and substrate P in mutually different directions (opposite directions) along the scanning direction, the pattern formed on mask M is exposed onto substrate P. In the following description, it is assumed that the synchronous movement direction (the scanning direction), of mask M and substrate P is referred to as the X-axis direction in a horizontal plane, that the direction perpendicular to the X-axis direction in the horizontal plane, is referred to as the Y-axis direction (the non-scanning direction), and that the direction that is perpendicular to the X-axis direction and to the Y-axis direction and coincides with optical axis AX of projection optical system PL is referred to as the Z-axis direction. Further, it is assumed that the rotation (inclination) directions around the X-axis, the Y-axis, and the Z-axis are respectively referred to as the θX-direction, the θY-direction, and the θZ-direction. It should be noted that a "substrate" referred to herein comprehends a semiconductor wafer over which photoresist is applied and that a "mask" comprehends a reticle on which a device pattern to be reduction projected onto a substrate is formed.

Conveyance system H is provided with first arm member H1 that carries (loads) substrate P, that has not yet experienced an exposure process, to substrate stage PST and with second arm member H2 that carries out (unloads) substrate P, that has experienced an exposure process, from substrate stage PST. Substrate P that has been conveyed from coater apparatus C and has not yet experienced an exposure process is delivered to third arm member H3 via interface portion IF. Third arm member H3 delivers substrate P to prealignment portion PAL. Prealignment portion PAL performs a rough alignment of substrate P relative to substrate stage PST. Imaging device 80 is provided above prealignment portion PAL, and prealignment portion PAL is disposed within the imaging area (imaging field of view). Further, imaging device 80' is provided above the conveyance path, of substrate P having experienced an exposure process, between substrate stage PST and holding table HT. Substrate P having been aligned at prealignment portion PAL is loaded on substrate stage PST by first arm member H1. Substrate P having experienced an exposure process is unloaded from substrate stage PST by second arm member H2. Second arm member H2 delivers substrate P having experienced an exposure process to holding table HT that is provided on the conveyance path of substrate P. Holding table HT constitutes a part of liquid removal system 100 and temporarily holds the delivered substrate P. Holding table HT is disposed inside cover member 70, and cover member 70 is provided with opening portion 71 and opening portion 72 for making substrate P pass. Opening portion 71 and opening portion 72 are provided with shutter portion 71A and shutter portion 72A, respectively, and shutter portion 71A and shutter portion 72A open/close opening portion 71 and opening portion 72, respectively. Holding table HT is rotatable while holding substrate P, and substrate P of which orientation has been changed with the aid of the rotation of holding table HT is held by fourth arm member H4 and is conveyed to interface portion IF. Substrate P having been conveyed to interface portion IF is delivered to development apparatus D. Development apparatus D applies a development process to the delivered substrate P.

Further, first to fourth arm members H1-H4, prealignment portion PAL, imaging apparatus 80, and, also, holding table HT are disposed inside first chamber apparatus CH1. Here, to each of the portions, of first and second chamber apparatuses CH1 and CH2, that face interface portion IF are provided an opening portion and a shutter that opens/closes the opening portion. These shutters are opened during the conveyance operation of substrate P relative to interface portion IF.

Imaging apparatus 80 is for imaging the surface of substrate P held by prealignment portion PAL. The imaging results from imaging apparatus 80 are outputted to controller CONT, and controller CONT acquires the surface information of substrate P based on the imaging results from imaging apparatus 80.

Imaging apparatus 80' is for imaging the surface of substrate P having experienced an exposure process, before it is conveyed to holding table HT. The imaging results from imaging apparatus 80' are outputted to controller CONT, and controller CONT acquires the surface information of substrate P based on the imaging results from imaging apparatus 80'.

First arm member H1 holds substrate P which has not yet experienced an exposure process and on which liquid LQ is not adhering and then loads substrate P on substrate stage PST. On the other hand, second arm member H2 holds substrate P which has experienced an exposure process and on which liquid LQ may be adhering and then unloads substrate P from substrate stage PST. Since, in this way, first arm member H1 that conveys substrate P on which liquid LQ is not adhering is used separately from second arm member H2 that conveys substrate P on which liquid LQ may be adhering, liquid LQ does not adhere to first arm member H1, and thus adhesion of liquid LQ to, e.g., the back surface of substrate P to be loaded on substrate stage PST can be prevented. Accordingly, even when it is configured such that the substrate holder of substrate stage PST vacuum sucks and holds substrate P, occurrence of the disadvantage that liquid LQ penetrates, via the suction holes of the substrate holder, to the vacuum system, e.g., a vacuum pump can be precluded. Since, as shown in FIG. 1 the conveyance path of second arm member H2 is located under the conveyance path of second arm member H1, the possibility that liquid LQ adhering on the surface or the back surface of substrate P adheres to substrate P which has not yet been exposed and which is held by first arm member H1 is low.

Figure 3:
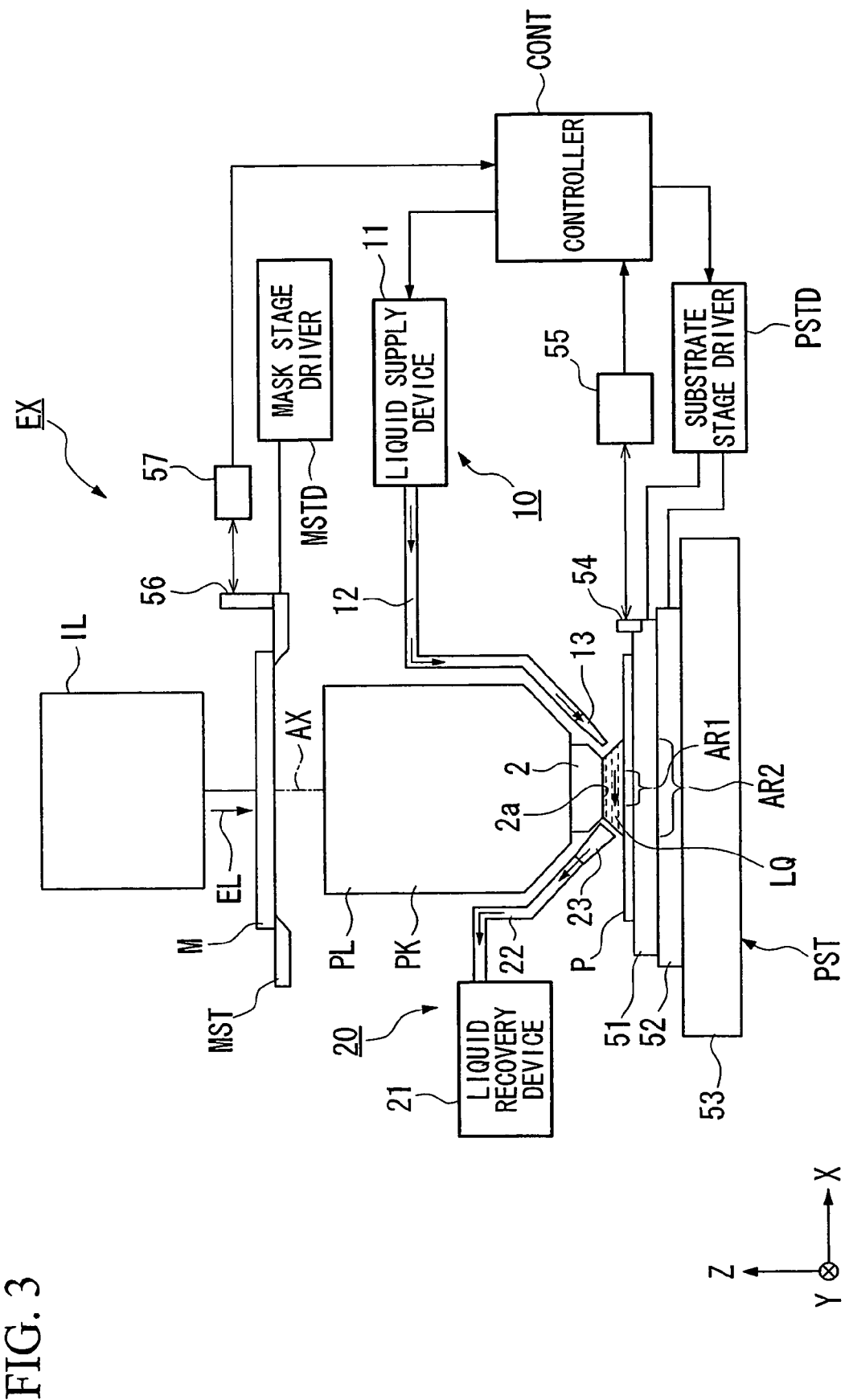
FIG. 3 is a schematic diagram showing an embodiment of an exposure apparatus main body that performs exposure processes.

FIG. 3 is a schematic diagram of exposure apparatus main body EX. Illumination optical system IL is for illuminating mask M supported by mask stage MST with exposure light EL and comprises an exposure light source, an optical integrator for uniforming the illuminance of a light flux emitted from the exposure light source, a condenser lens for condensing exposure light EL from the optical integrator, a relay lens system, a variable field stop for setting an illumination area on mask M formed by exposure light EL to be of a slit-like shape, etc. A specified illumination area on mask M is illuminated, by illumination optical system IL, with exposure light EL having a uniform illuminance distribution. As exposure light EL emitted from illumination optical system IL, for example, a bright line of ultraviolet region (g-line, h-line, i-line) emitted from a mercury lamp, a deep ultraviolet light (DUV light) such as a KrF excimer laser light (wavelength of 248 nm), and a vacuum ultraviolet light (VUV light) such as an ArF excimer laser light (wavelength of 193 nm) or an $F_2$ excimer laser light (wavelength of 157 nm) may be used. In the embodiment, description will be made with reference to a case in which an ArF excimer laser light is used.

Mask stage MST is for supporting mask M, is two-dimensionally movable in a plane perpendicular to optical axis AX, i.e., in the XY-plane, and is finely rotatable in the θZ-direction. Mask stage MST is driven by mask stage driver MSTD such as a linear motor. Mask stage driver MSTD is controlled by controller CONT. On mask stage MST is set moving mirror 56, and at a position facing moving mirror 56 is positioned laser interferometer 57. The two-dimensional position and the rotation angle of mask stage MST holding mask M are measured by the laser interferometer in real time, and the measurement results are outputted to controller CONT. By driving mask stage driver MSTD based on the measurement results from the laser interferometer, controller CONT performs positioning of mask M supported by mask stage MST.

Projection optical system PL is for projecting the pattern of mask M onto substrate P at a predetermined projection magnification of β and is constituted by a plurality of optical elements (lenses and/or mirrors), and those optical elements are contained in lens barrel PK. In the embodiment, projection optical system PL is a reduction system of which projection magnification β is, e.g., ¼ or ⅕. It should be noted that projection optical system PL may also be either a unit magnification system or a magnifying system. Further, at the end side (side of substrate P) of projection optical system PL of the embodiment, optical element (lens) 2 protrudes from lens barrel PK. Optical element 2 is detachably (exchangeably) disposed relative to lens barrel PK.

Optical element 2 is made of fluorite. Since fluorite has a high affinity for purified water, liquid LQ can be made to be in tight contact with substantially the entire surface of the end surface (liquid contact surface) 2a of optical element 2. More specifically, since, in the embodiment, it is configured such that liquid (water) LQ having a high affinity for liquid contact surface 2a of optical element 2 is supplied, the contact degree between liquid contact surface 2a of optical element 2 and liquid LQ is high. It should be noted that optical element 2 may be made of quartz, which has a high affinity for water. Further, it may be configured such that liquid contact surface 2a of optical element 2 is applied with hydrophilic (lyophilic) treatment to enhance the affinity for liquid LQ.

Substrate stage PST is for supporting substrate P and is provided with Z stage 51 that holds substrate P via a substrate holder, XY stage 52 that supports Z stage 51, and base 53 that supports XY stage 52. Substrate stage PST is driven by substrate stage driver PSTD such as a linear motor. Substrate stage driver PSTD is controlled by controller CONT. By driving Z stage 51, the Z-direction position (focus position) and the θX- and θY-direction positions of substrate P held by Z stage 52 are controlled. Further, by driving XY stage 52, the XY-direction position (the position in the direction substantially parallel to the image plane of projection optical system PL) of substrate P is controlled. More specifically, Z stage 51, by controlling the focus position and inclination angle of substrate P, makes the surface of substrate P to coincide with the image plane of projection optical system PL by means of an autofocus system and an autoleveling system; XY stage 52 performs positioning of substrate P in the X-axis and Y-axis directions. It is to be noted that needless to say, the Z stage and the XY stage may be integrally constructed.

On substrate stage PST (Z stage 51) is set moving mirror 54. Further, laser interferometer 55 is positioned at a position facing moving mirror 54. The two-dimensional position and the rotation angle of substrate P on substrate stage PST are measured by laser interferometer 55 in real time, and the measurement results are outputted to controller CONT. By driving substrate stage driver PSTD based on the measurement results from laser interferometer 55, controller CONT performs positioning of substrate P supported by substrate stage PST.

In the embodiment, a liquid immersion method is applied to, with the exposure wavelength being shortened in effect, improve the resolution and, at the same time, to widen the depth of focus in effect. For that purpose, at least while the pattern image of mask M is being transferred onto substrate P, the space between the surface of substrate P and the end surface 2a of optical element 2 of projection optical system PL is filled with the predetermined liquid LQ. As described above, optical element 2 protrudes at the end side of projection optical system PL, and it is configured such that liquid LQ is in contact with only optical element 2. By this, for example, rusting of lens barrel PK made of a metal is prevented. In the embodiment, purified water is used as liquid LQ. Purified water can transmit not only ArF excimer laser light, but also exposure light EL even when it is, for example, a bright line of ultraviolet region (g-line, h-line, or i-line) emitted from a mercury lamp or deep ultraviolet light (DUV light) such as KrF excimer laser light (wavelength of 248 nm).

Exposure apparatus main body EX is provided with liquid supply mechanism 10 that supplies liquid LQ to the space between the surface of substrate P and the end surface 2a of optical element 2 of projection optical system PL and with liquid recovery mechanism 20 that recovers liquid LQ on substrate P. Liquid supply mechanism 10 is for supplying the predetermined liquid LQ to form liquid immersion region AR2 on substrate P and is provided with liquid supply device 11 that is capable of delivering liquid LQ and with supply nozzles 13 that are connected to liquid supply device 11 via supply pipe 12 and has a supply port that supplies, on substrate P, liquid LQ delivered from liquid supply device 11. Supply nozzle 13 is disposed in close vicinity to the surface of substrate P.

Liquid supply device 11 is provided with a tank that stores liquid LQ, a pressurizing pump, etc. and supplies liquid LQ onto substrate P via supply pipe 12 and supply nozzles 13. Further, the liquid supply operation of liquid supply device 11 is controlled by controller CONT, and controller CONT can control the per-unit-time liquid supply amount onto substrate P by liquid supply device 11. Further liquid supply device 11 has a temperature adjustment mechanism of liquid LQ, and it is configured such that liquid LQ having substantially the same temperature (e.g., 23° C.) as the temperature in the chamber in which the exposure apparatus is accommodated is supplied onto substrate P.

Liquid recovery mechanism 20 is for recovering liquid LQ on substrate P and is provided with recovery nozzles 23 that are disposed in close vicinity to, but not in contact with, the surface of substrate P and with liquid recovery device 21 that is connected to this recovery nozzles 23 via recovery pipe 22. Liquid recovery device 21 is provided with a vacuum system (suction device), e.g., a vacuum pump, a tank that stores liquid LQ recovered, etc. and recovers liquid LQ on substrate P via recovery nozzles 23 and recovery pipe 22. Further, the liquid recovery operation of liquid recovery device 21 is controlled by controller CONT, and controller CONT can control the per-unit-time liquid recovery amount by liquid recovery device 21.

During scanning exposure, a pattern image of a part of mask M is projected onto the rectangular projection area AR1 beneath optical element 2 located at the end of projection optical system PL, and in synchronization with the movement of mask M in the −X direction (or in the +X direction) at speed V, substrate P moves, via XY stage 52, in the +X direction (or in the −X direction) at speed $\beta \cdot V$ ($\beta$ is the projection magnification). And, after completion of exposure of one shot area, a next shot area is brought to the scanning starting point through the stepping movement of substrate P, and in this way, exposure of each shot area is successively performed through the step-and-scan method. In the embodiment, it is set such that liquid LQ is made to flow along the moving direction of substrate P.

Figure 4:
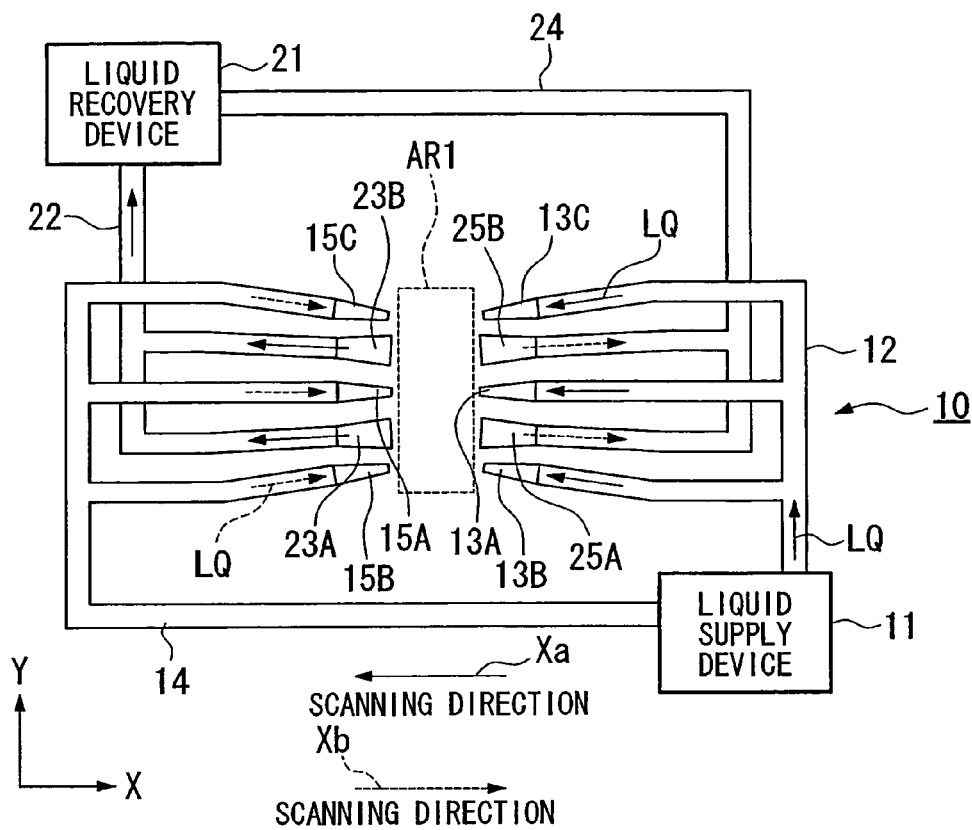
FIG. 4 is a diagram showing a layout example of supply nozzles and recovery nozzles.

FIG. 4 is a diagram illustrating the relationship among projection area AR1 of projection optical system PL, supply nozzles 13 (13A-13C) that supply liquid LQ in the x-direction, and recovery nozzles 23 (23A, 23B) that recover liquid LQ. In FIG. 4, the shape of projection area AR1 is of a rectangle shape elongated in the Y-direction; three supply nozzles 13A-13C are disposed in the +X direction side and two recovery nozzles 23A and 23B are disposed in the −X direction side so that projection area AR1 is located between the three supply nozzles and the two recovery nozzles. And, supply nozzles 13A-13C are connected to liquid supply device 11 via supply pipe 12, and recovery nozzles 23A and 23B are connected to liquid recovery device 21 via recovery pipe 22. Further, supply nozzles 15A-15C and recovery nozzles 25A and 25B are disposed in the positional relationship in which supply nozzles 13A-13C and recovery nozzles 23A and 23B are rotated by substantially 180 degrees. Supply nozzles 13A-13C and recovery nozzles 25A and 25B are disposed alternately in the Y-direction; supply nozzles 15A-15C and recovery nozzles 23A and 23B are disposed alternately in the Y-direction; supply nozzles 15A-15C are connected to liquid supply device 11 via supply pipe 14; recovery nozzles 25A and 25B are connected to liquid recovery device 21 via recovery pipe 24.

When scan-exposing substrate P by moving the substrate in the scanning direction (−X direction) indicated by arrow Xa, the supply and the recovery of liquid LQ are performed by liquid supply device 11 and liquid recovery device 21, by the use of supply pipe 12, supply nozzles 13A-13C, recovery pipe 22, and recovery nozzles 23A and 23B. More specifically, when substrate P moves in the −X direction, liquid LQ is supplied, from liquid supply device 11, onto substrate P via supply pipe 12 and supply nozzles 13 (13A-13C), and, at the same time, liquid LQ is recovered by and into liquid recovery device 21 via recovery nozzles 23 (23A, 23B) and recovery pipe 22, with liquid LQ flowing in the −X direction such that the space between projection optical system PL and substrate P is filled with the liquid. On the other hand, when scan-exposing substrate P by moving the substrate in the scanning direction (+X direction) indicated by arrow Xb, the supply and the recovery of liquid LQ are performed by liquid supply device 11 and liquid recovery device 21, by the use of supply pipe 14, supply nozzles 15A-15C, recovery pipe 24, and recovery nozzles 25A and 25B. More specifically, when substrate P moves in the +X direction, liquid LQ is supplied, from liquid supply device 11, onto substrate P via supply pipe 14 and supply nozzles 15 (15A-15C), and, at the same time, liquid LQ is recovered by and into liquid recovery device 21 via recovery nozzles 25 (25A, 25B) and recovery pipe 24, with liquid LQ flowing in the +X direction such that the space between projection optical system PL and substrate P is filled with the liquid. In this way, controller CONT, by using liquid supply device 11 and liquid recovery device 21, makes liquid LQ flow along the moving direction of substrate P and in the same direction as the moving direction of substrate P. In this case, liquid LQ supplied from liquid supply device 11 via, e.g., supply nozzles 13 flows in the manner that the liquid, being induced by the −X direction movement of substrate P, is pulled into the space between projection optical system PL and substrate P, and thus, even if the supply energy of liquid supply device 11 is small, liquid LQ can be easily supplied to the space between projection optical system PL and substrate P. And, by changing, in response to the scanning direction, the direction in which liquid LQ is made to flow, the space between projection optical system PL and substrate P can be filled with liquid LQ, in both of the case where substrate P is scanned in the +X direction and in the case where substrate P is scanned in the −X direction, which makes it possible to obtain a high resolution and a wide depth of focus.

Figure 5:
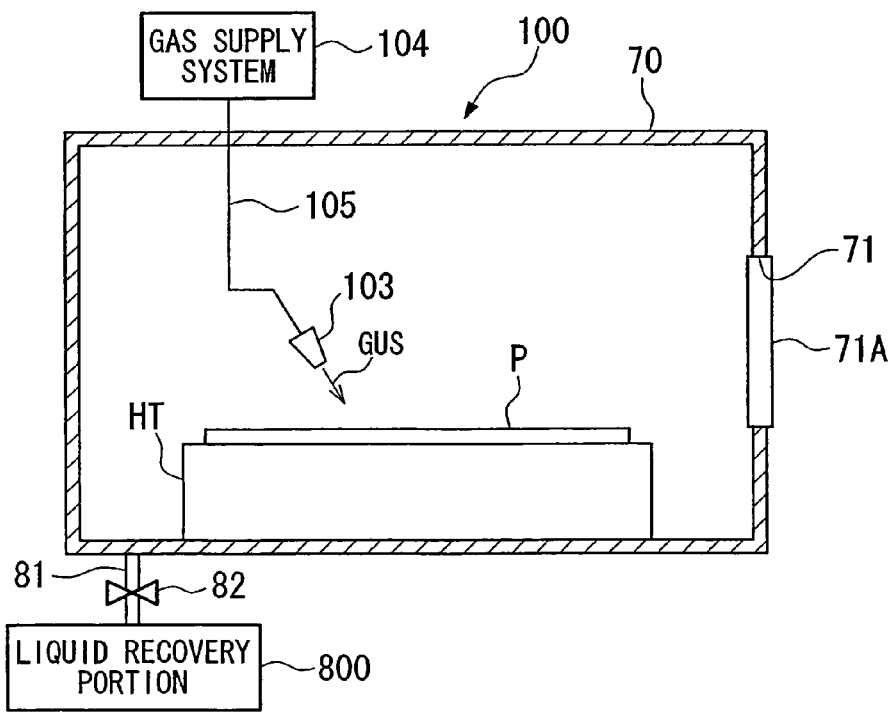
FIG. 5 is a schematic diagram showing an embodiment of a liquid removal system.

FIG. 5 is a diagram showing liquid removal system 100. Second arm member H2 holding substrate P having experienced a liquid immersion exposure process enters, through opening portion 71, cover member 70 accommodating holding table HT. During this process, by driving shutter portion 71A, controller CONT keeps opening portion 71 open. On the other hand, opening portion 72 is closed by shutter portion 72A. And, before substrate P is delivered to holding table HT, a blowing nozzle, not shown, by blowing a gas against the back surface of substrate P, removes the liquid adhering on the back surface of substrate P. Subsequently, second arm member H2 delivers substrate P to holding table HT. Holding table HT vacuum sucks and holds the delivered substrate P.

Inside cover member 70 is disposed blowing nozzle 103 that constitutes a part of liquid removal system 100, and to blowing nozzle 103 is connected gas supply system 104 via flow path 105. In flow path 105 is provided a filter that removes the foreign substances (dust and/or oil mist) in the gas to be blown against substrate P. And, with gas supply system 104 being driven, a predetermined gas is blown against the surface of substrate P via flow path 105, and liquid LQ adhering on the surface of substrate P is, by the blown gas, blown off and removed.

To cover member 70 is connected liquid recovery portion 800 via recovery pipe 81. To recovery pipe 81 is provided bulb 82 that opens/closes the flow path of recovery pipe 81. Liquid LQ having been blown off from substrate P is recovered by liquid recovery portion 800, which is connected to cover member 70. By sucking the gas inside cover member 70 along with the flying liquid LQ, liquid recovery portion 800 recovers liquid LQ having been blown off from substrate P. Here, liquid recovery portion 800 continuously performs the sucking operation of the gas inside cover member 70 and the flying liquid LQ. By this, liquid LQ does not stay inside cover member 70, e.g., on the inner walls and/or bottom of cover member 70, and thus the humidity in cover member 70 does not fluctuate significantly. Further, even when shutter portions 71A and 72A are opened, damp gas inside cover member 70 does not flow out to the outside of cover member 70.

It should be noted that while in the embodiment, by blowing a gas against substrate P, liquid removal system 100 removes liquid LQ, liquid LQ adhering on substrate P can be removed also by, for example, sucking liquid LQ adhering on substrate P, by vaporizing liquid LQ by supplying a dry gas (dry air), or by blowing off the adhering liquid LQ by spinning substrate P around. Also, by bringing an absorbent material into contact with substrate P to absorb the adhering liquid LQ, the liquid can be removed.

Figure 6:
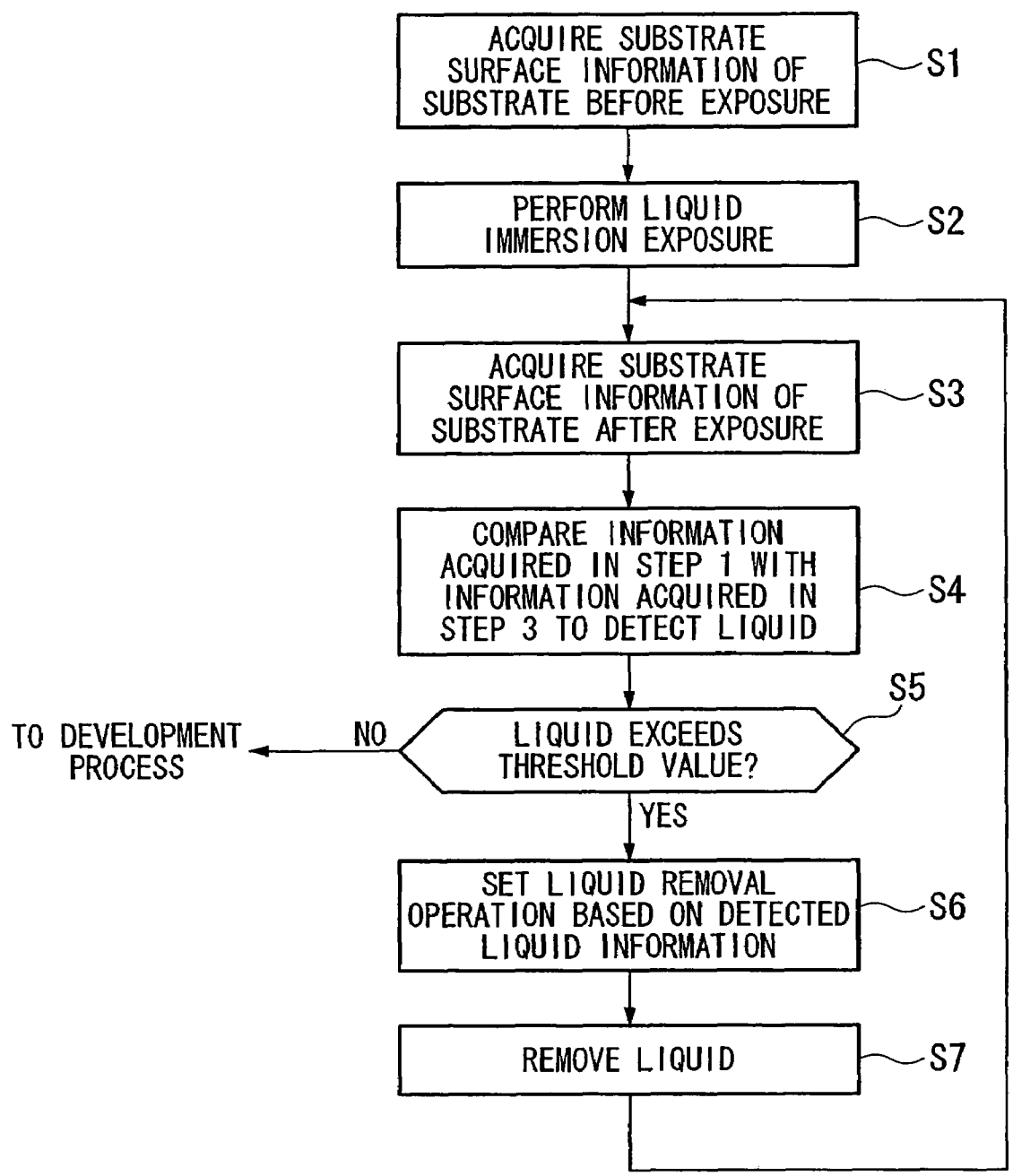
FIG. 6 is a flowchart showing an embodiment of an exposure method of the present invention.

Next, the operations of the above-described exposure apparatus main body EX and conveyance system H will be described referring to the flow chart diagram of FIG. 6.

Substrate P that has not yet been exposed is delivered by third arm member H3 from coater apparatus C to prealignment portion PAL. Prealignment portion PAL performs a rough alignment of substrate P that has not yet been exposed. Subsequently, imaging device 80 images the surface of the aligned substrate P that has not yet been exposed. By doing so, first information (imaging information) on the surface of the aligned substrate P that has not yet been exposed is acquired (step S1). The acquired first information on the surface of substrate P is stored in controller CONT.

Next, substrate P having been aligned at prealignment portion PAL is loaded, by first arm member H1, on substrate stage PST of exposure apparatus main body EX. Substrate P held by substrate stage PST is subjected to a liquid immersion exposure process (step S2).

After the exposure processes on all of the multiple shot areas set on substrate P are completed, controller CONT stops the liquid supply onto substrate P by liquid supply mechanism 10. Meanwhile, controller CONT continues to drive liquid recovery mechanism 20 for a predetermined period of time even after stopping the liquid supply operation by liquid supply mechanism 10. By this, liquid LQ on substrate P is sufficiently recovered.

Substrate P having been exposed is unloaded from substrate stage PST by second arm member H2. Second arm member H2 conveys substrate P held by the arm member toward holding table HT of liquid removal system 100.

Here, liquid LQ may be adhering on the surface of substrate P and/or on the area, of the back surface of substrate P, other than the area supported by second arm member H2. However, since as shown in FIG. 1, to the conveyance path between substrate stage PST and holding table HT, among the conveyance path of substrate P, is arranged recovery mechanism 60 that recovers liquid LQ having dropped from substrate P having been exposed, the liquid LQ's adhesion and/or scattering to the surrounding devices and/or members on the conveyance path from substrate P can be prevented even if substrate P is conveyed in a state that liquid LQ is adhering on substrate P. Here, recovery mechanism 60 is provided, as shown in FIG. 1, with drainpipe member 61 disposed under the conveyance path of second arm member H2 and liquid suction device 62 that drains liquid LQ recovered via drainpipe member 61 from drainpipe member 61. Drainpipe member 61 is provided inside first chamber apparatus CH1, and liquid suction device 62 is provided outside first chamber apparatus CH1. Drainpipe member 61 and liquid suction device 62 are connected via conduit 63, and conduit 63 is provided with bulb 63A that opens/closes the flow path of conduit 63.

Liquid LQ may drop from the exposed substrate P on which liquid LQ is adhering is being conveyed by second arm member H2. However, the liquid LQ having dropped can be recovered by drainpipe member 61. By recovering the dropped liquid LQ by drainpipe member 61, disadvantages, e.g., the disadvantage that liquid LQ scatters around the conveyance path, can be prevented. Further, liquid suction device 62, by sucking liquid LQ on drainpipe member 61 provided inside first chamber apparatus CH1, drains the liquid to the outside of first chamber apparatus CH1, which can make liquid LQ not stay on drainpipe member 61 located inside first chamber apparatus CH1, and thus the disadvantage that humidity fluctuation (ambience fluctuation) occurs in first chamber apparatus CH1 can be prevented. Here, liquid suction device 62 may continuously perform the suction operation of liquid LQ recovered by drainpipe member 61 or may intermittently perform the suction operation (draining operation) only for a preset period of time. Since with the suction operation being continuously performed, liquid LQ does not stay on drainpipe member 61, the humidity fluctuation in first chamber apparatus CH1 can be prevented more effectively. On the other hand, by not performing the suction operation by liquid suction device 62 during the exposure of substrate P in exposure apparatus main body EX and by performing the suction operation only for the time period other than the exposure time period, such a disadvantage as that vibrations generated by the suction operation affect the exposure accuracy can be precluded.

Before substrate P having experienced an exposure process is conveyed to holding table HT of liquid removal system 100, the substrate is positioned under imaging device 80'. And, imaging device 80' acquires second information (imaging information) on the surface of substrate P having experienced an exposure process (step S3).

After the second information on the surface of substrate P having experienced an exposure process has been acquired, second arm member H2 holding substrate P having experienced an exposure process enters cover member 70 through opening portion 71 to convey substrate P having experienced an exposure process to holding table HT.

Controller CONT compares the imaging information acquired in step S1 with the imaging information acquired in step S3 and detects whether the liquid is adhering on substrate P having experienced an exposure process (step S4).

Since the imaging condition in which liquid LQ is adhering on the surface of substrate P and the imaging condition in which liquid LQ is not adhering thereon differ from each other, controller CONT can, by comparing the imaging information on the surface of substrate P that has not yet been exposed with the imaging information on the surface of substrate P that has been exposed, detect whether liquid LQ is adhering thereon. Further, if the position of substrate P at the time of imaging in step S1 coincide with the position of substrate P at the time of imaging in step S3, then controller CONT can determine the information on the position of the liquid (droplet) adhering on substrate P and also the information on the size of the droplet.

It is to be noted that since, even when the position of substrate P at the time of imaging in step S1 does not coincide with the position of substrate P at the time of imaging in step S3, on the peripheral portion of substrate P is formed a cut portion (an orientation flat or a notch) for detecting the position of substrate P, controller CONT can, with reference to the cut portion, make the imaging information in step S1 and the imaging information in step S3 coincide with each other on a data basis.

Controller CONT determines whether the detected amount of liquid LQ on substrate P exceeds a preset threshold value. Subsequently, based on the determination result, controller CONT determines whether the removal operation of liquid LQ adhering on substrate P should be performed (step S5).

When it is determined in step S5 that the detected amount does not exceed the threshold value, controller CONT determines that the liquid removal operation is unnecessary and by using fourth arm member H4, etc., conveys substrate P from holding table HT to development device D, via interface portion IF. In other words, when the amount of liquid LQ adhering on substrate P is very small (does not exceed the threshold value) and thus is in the range in which the amount does not affect the device performance and/or the processing (development process), controller CONT determines that the liquid removal operation is unnecessary. By this, it is prevented that although liquid LQ is not adhering on substrate P, the liquid removal operation is performed again by using liquid removal system 100; and thus the operation efficiency can be improved. It is to be noted that the above-described threshold value has been determined beforehand through, e.g., an experiment and has been stored in controller CONT.

In contrast, when it is determined in step S5 that the detected amount exceeds the threshold value, controller CONT activates liquid removal system 100. In this process, controller CONT sets, based on the detected liquid information, the liquid removal operation conditions under which the liquid removal from substrate P on which liquid LQ is adhering is performed (step S6).

Since, in step S4, the amount (the size of droplet) and/or the position information of liquid LQ adhering on substrate P have been detected, controller CONT sets, based on, e.g., the amount (the size of droplet) of liquid LQ adhering on substrate P, the flow velocity (per-unit-time blown gas amount) and the blowing time of the gas to be blown from blowing nozzle 103. Alternatively, controller CONT may also set, based on the position information of liquid LQ adhering on substrate P, the position on substrate P against which the gas is to be blown by blowing nozzle 103. For example, by doing so, when the adhering liquid amount is small, by setting the liquid removal operation time (gas blowing time) to be a short time, the operation time can be shortened; in contrast, when the adhering liquid amount is large, by setting the liquid removal operation time (gas blowing time) to be a long time, liquid LQ can be reliably removed.

Alternatively, the liquid removal operation conditions may be set in accordance with the resist condition of substrate P and the liquid condition including the physical properties of liquid LQ. More specifically, since the easiness with which liquid LQ is blown off from substrate P may vary depending upon the physical properties of the resist and the liquid LQ, it can be configured, for example, such that in the case of a condition under which the liquid can be easily blown off, the gas blowing time is shortened, and in the case of a condition under which the liquid can not be easily blown off, the gas blowing time is increased, or the flow velocity of the gas blown is increased.

Further, after obtaining a record of liquid detection results regarding a plurality of substrates P, the liquid removal operation conditions may be set based on the record information. More specifically, since, as described above, the easiness with which liquid LQ is removed may vary depending upon the resist conditions and the liquid conditions, by obtaining the record of the liquid amount remaining on the substrates P corresponding to the resist conditions and the liquid conditions, optimum liquid removal operation conditions can be set based on the obtained results.

After setting the liquid removal operation conditions, controller CONT blows the gas against substrate P from blowing nozzle 103 and removes the adhering liquid LQ (step S7).

Further, after performing the liquid removal operation, controller CONT convey again, by using fourth arm member H4, etc., substrate P to the inside of the imaging area of imaging device 80' and images the surface of substrate P by the use of imaging device 80'. Thereafter, the above-described processes are repeated until the amount of the adhering liquid LQ comes not to exceed the threshold value.

As described above, with liquid LQ adhering on substrate P being detected by using imaging device 80' when substrate P having been liquid immersion exposed is conveyed, for example, in the case where liquid LQ is adhering on substrate P, substrate P can be conveyed to a predetermined process device, e.g., development device D, after the liquid has been removed by liquid removal system 100. Thus, the process, e.g., the development process can be performed without being affected by liquid LQ, and thus a device having a desired performance can be produced. In addition, in the case where based on the liquid detection results, it is determined that liquid LQ is not adhering on substrate P, the liquid removal operation can be omitted, which improves the operation efficiency. Further, with the detection of liquid on substrate P being performed again after the liquid removal operation has been performed, it can be detected whether the liquid removal has been performed well. Further, with the liquid removal operation being performed based on the liquid detection results, occurrence of, e.g., the disadvantage that liquid LQ drops from substrate P being conveyed onto the conveyance path can be prevented. Still further, in the case where it is configured such that the arm members of conveyance system H vacuum suck and hold substrate P, with liquid LQ adhering on substrate P being removed, occurrence of, e.g., the disadvantage that liquid LQ penetrates the vacuum system and the vacuum system breaks down can be prevented.

Furthermore, since the embodiment is configured such that for a single substrate P, the surface information before the exposure is compared with the surface information after the exposure and before the development, the information on the liquid adhering substrate P can be obtained with high accuracy.

It is to be noted that imaging device 80' may be provided in the vicinity of substrate stage PST or in the vicinity of liquid removal system 100 so long as the imaging device is disposed above the conveyance path of substrate P having experienced an exposure process between substrate stage PST and holding table HT. Further, by movably providing imaging device 80 above the conveyance path between substrate stage PST and holding table HT, imaging device 80' may be omitted. Further, it may also be configured such that imaging device 80' is provided inside cover member 70.

It should be noted that it can also be configured such that in order to detect liquid LQ adhering on the surface of substrate P, by irradiating a detection light on the surface of substrate P before exposure and by receiving the detection light reflected by the surface of substrate P by the imaging device or a predetermined photodetector to obtain first light reflectivity information of the surface of substrate P and then by irradiating the detection light on the surface of substrate P after exposure and by receiving the detection light reflected by the surface of substrate P by to obtain second light reflectivity information of the surface of substrate P, it is detected, based on the first light reflectivity information and the second light reflectivity information, whether liquid LQ is adhering on substrate P. Since the light reflectivity of liquid LQ and the light reflectivity of the surface (resist) of substrate P differ from each other, the light reflectivity of substrate P on which liquid LQ is adhering and the light reflectivity of substrate P on which liquid LQ is not adhering differ from each other. Thus, by obtaining the first light reflectivity information and the second light reflectivity information, liquid LQ can be detected. It is to be noted that the second light reflectivity information includes the light reflectivity information of the surface of substrate P after exposure and the light reflectivity information of liquid LQ.

It is to be noted that besides the configuration in which after detecting the light reflectivity information of the surface of a single substrate P before exposure, the light reflectivity information of the surface of substrate P after exposure is detected, it can be also configured, for example, such that with the light reflectivity information of the surface of substrate P in a state that liquid LQ is adhering on the surface and the light reflectivity information of substrate P in a state that liquid LQ is not adhering on substrate P being obtained beforehand through, e.g., an experiment or a simulation and being stored in controller CONT, it is determined, based on the detection results of the light reflectivity of the surface of substrate P after exposure and the above-described stored information, whether liquid LQ is adhering on substrate P.

It is to be noted that it may also be configured such that with the surface of substrate P being imaged by the imaging device and with the imaging results being outputted on a monitor, an operator determines whether liquid LQ is adhering on the surface. Further, it may also be configured such that with substrate P being irradiated with a light (monochromatic light) and with the image obtained by imaging substrate P being subjected to an image processing, it is determined based on the image processing results whether liquid LQ is adhering on the substrate. Further, before imaging the surface by the imaging device, substrate P may be inclined or rotated.

It is to be noted that while, in the embodiment, it is detected whether liquid LQ is adhering on the surface (exposure surface) of substrate P, it may also be detected whether the liquid is adhering on the back surface of substrate P, wherein the back surface is to be supported by predetermined supporting members such as the arm members. Thus, based on the detection results, the removal operation of the liquid adhering on the back surface of substrate P can be performed.

Figure 7:
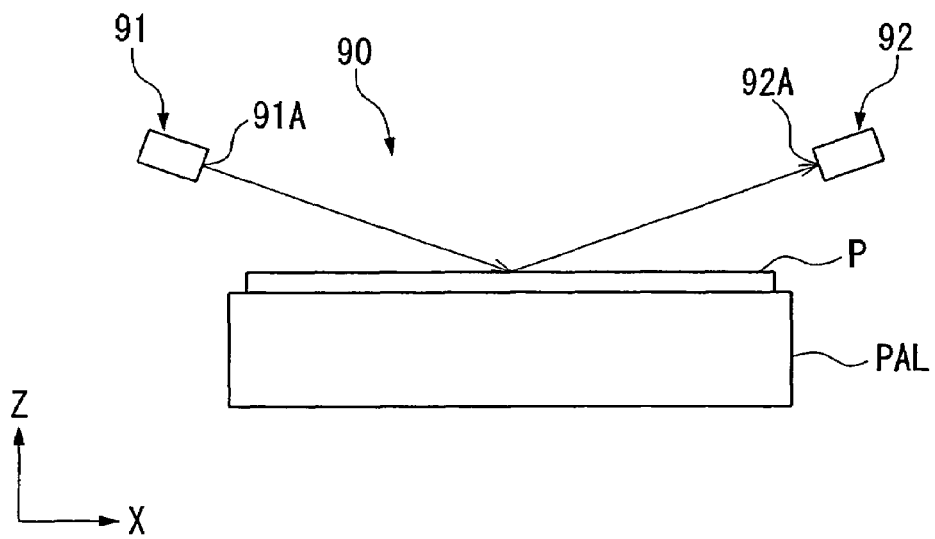
FIG. 7 is a side view showing another embodiment of a liquid detector associated with the present invention.
Figure 8:
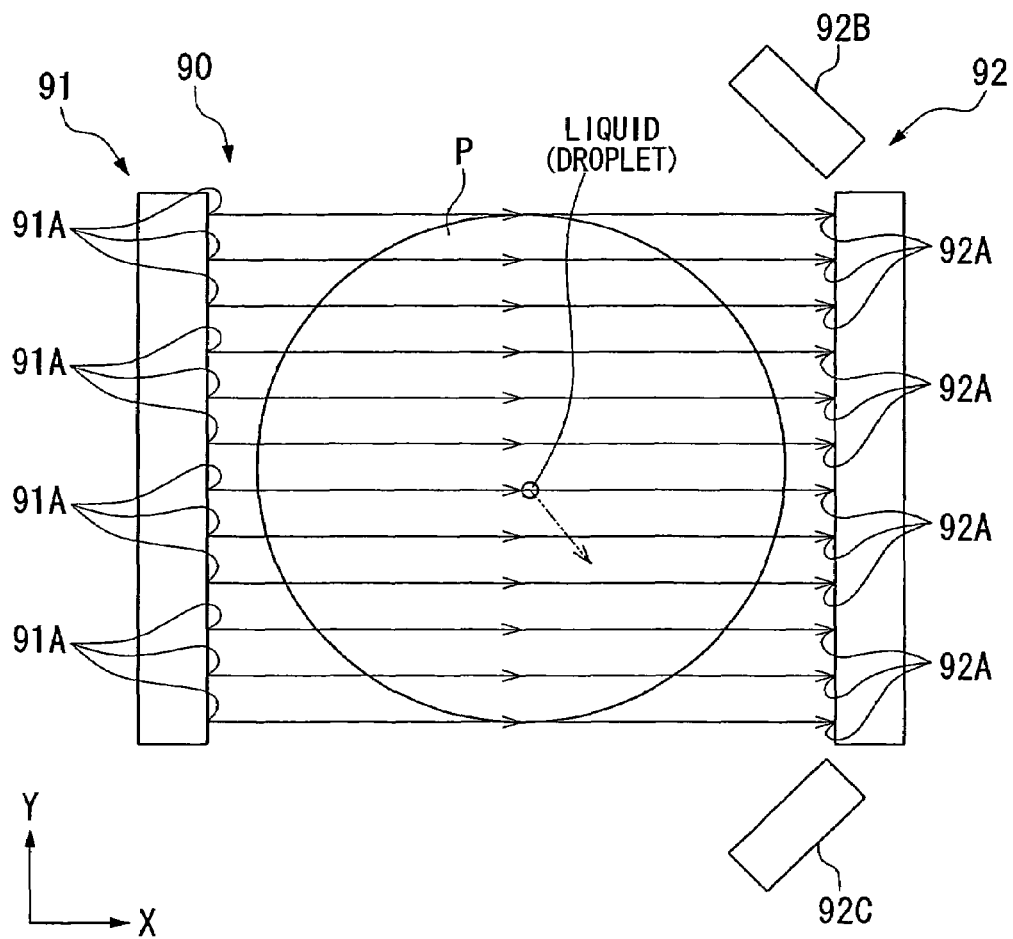
FIG. 8 is a plan view of FIG. 7.

FIGS. 7 and 8 show another embodiment of the liquid detector; FIG. 7 is a side view; FIG. 8 is a plan view.

Liquid detector 90 is for optically detecting liquid LQ adhering on the surface of substrate P and is provided with irradiation system 91 that irradiates a detection light on the surface of substrate P after exposure and with light receiving system 92 that receives the detection light reflected by the surface of substrate P It is to be noted that while in the following description, the detection light is irradiated on substrate P in a state that substrate P is held by prealignment portion PAL, the detection light may be irradiated on substrate P in a state that substrate P is held by a predetermined supporting member provided, within the conveyance path range of substrate P, at a position separate from that of prealignment portion PAL.

Irradiation system 91 irradiates the detection light from a direction inclined relative to the surface of substrate P. Irradiation system 91 has a plurality of irradiation units 91A that are laid side-by-side in a predetermined direction (in this embodiment, in the Y-axis direction), and the detection light is irradiated on substrate P from each of irradiation units 91A. All of the incidence angles of the detection lights irradiated from the plurality of irradiation units 91A relative to the surface of substrate P are set to be the same angle. Light receiving system 92 has a plurality of light receiving units 92A that correspond to irradiation units 91A of irradiation system 91. When liquid LQ is not present on substrate P, the detection light projected from each of irradiation units 91A is reflected by the surface of substrate P and is received by light receiving units 92A.

Further, light receiving system 92 has light receiving units 92B and 92C each of which is positioned at a position where the detection lights from irradiation system 91 is not incident on the light receiving portion, and the scattered lights generated when the detection lights from irradiation system 91 hit liquid LQ on the surface of substrate P and are reflected thereby are received by the light receiving units 92B and 92C. It should be noted that in the case where by using liquid detector 90, liquid LQ on the surface of substrate P is detected, it may be configured such that with liquid detector 90 and substrate P being relatively moved, the detection lights are irradiated on the surface of substrate P.

Figure 9A:
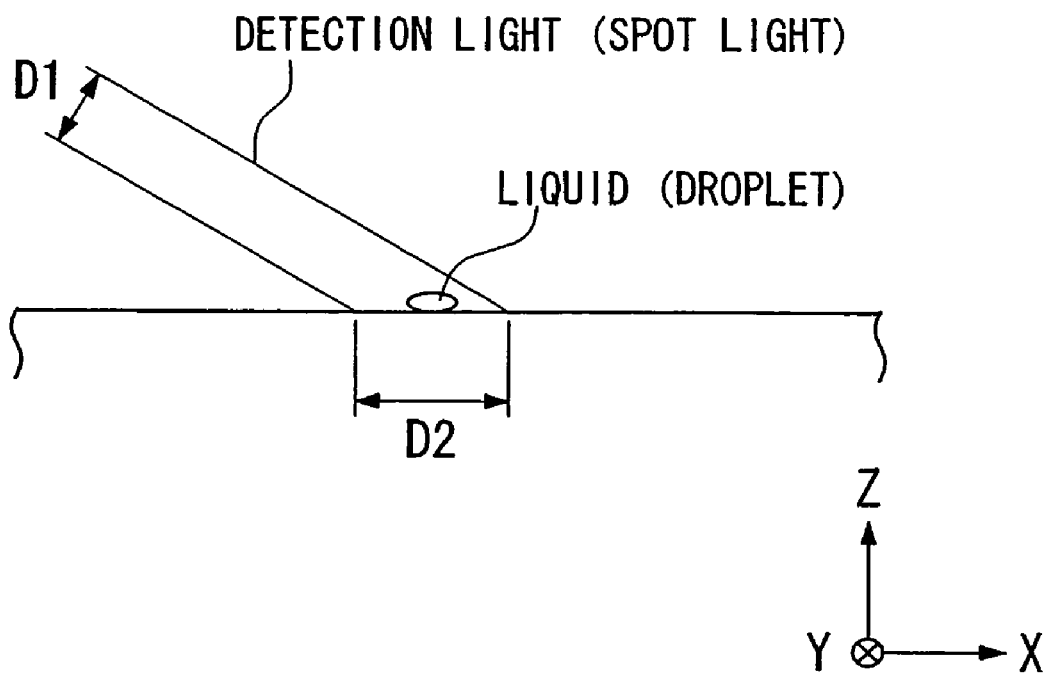
FIG. 9A is a diagram showing a state in which a detection light for liquid detection is irradiated on a substrate.
Figure 9B:
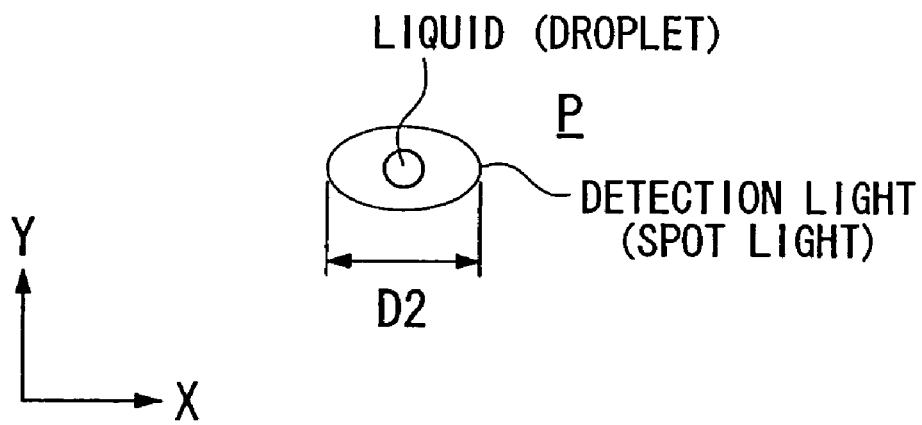
FIG. 9B is a diagram showing a state in which a detection light for liquid detection is irradiated on a substrate.

For example, when, as shown in FIG. 9A, the detection light is a spot light and the diameter of its light beam is D1, by projecting the detection light from a direction inclined relative to the surface of substrate P, the detection light on substrate P comes to have a form of an ellipsoid having its longitudinal direction in the X-direction (scanning direction), as shown in FIG. 9B. The longitudinal direction size D2 of the elliptical detection area on substrate P of the detection light is larger than the above-mentioned diameter D1. In other words, while, for example, when the detection light is irradiated from a perpendicular direction relative to the surface of substrate P, the X-direction size of the detection area of the detection light becomes D1, by irradiating the detection light from the inclined direction, the droplet of liquid LQ can be detected in the detection area, which has the X-direction size D2, which is larger than D1. Thus, when detecting the droplet of liquid LQ on substrate P by relatively moving liquid detector 90 and substrate P, the droplet comes to be detected in the larger detection area compared with the detection area of D1, and thus liquid detector 90 can improve the droplet detection accuracy. It is to be noted that the above description has been made on the assumption that the detection light is a spot light; however, a similar effect can be obtained even when the detection light is a slit light.

The detection light from irradiation system 91 is irradiated on the surface of substrate P. Here, when liquid LQ is present (adhering) on the surface of substrate P, the detection light irradiated on liquid LQ is scattered. Due to the scattering of a part of the detection light irradiated on liquid LQ, intense lights that are not detected in normal conditions enter light receiving units 92B and 92C, and the light intensity received by light receiving units 92A which corresponds to the detection light decreases. The detection results of light receiving units 92A, 92B, and 92C are outputted to controller CONT, and controller CONT can detect whether liquid LQ is adhering on the surface of substrate P, based on the light intensities detected by this light receiving system 92.

Here, controller CONT can determine the size and/or the amount of liquid LQ (droplet), based on the light intensities detected by light receiving units 92B and 92C. For example, since the angle of the scattered light varies depending upon the droplet size, controller CONT can, by determining the direction of the scattered light from liquid LQ (droplet) based on the detection results of light receiving units 92B and 92C, determine the size of liquid LQ (droplet). Further, by detecting the light intensities of the received lights, controller CONT can also determine the per-unit-area amount of liquid LQ (droplet) on the substrate P.

In this process, with a position detection device that detects the relative position in the XY-direction between the holding member, of prealignment portion PAL, that holds substrate P and liquid detector 90 being provided, the position of substrate P is identified, based on the detection results of the position detection device. In addition, the positional relationship in the Y-direction of light receiving units 92A that have received the detection light irradiated on liquid LQ (droplet) is identified, based on the design values. Thus, controller CONT can identify the position, on substrate P, at which liquid LQ (droplet) is present, based on the detection results of the position detection device and the information on the disposed position of light receiving portions 92A at which the light intensity received has decreased.

It is to be noted that as the detection light to be irradiated on substrate P, for example, an ultraviolet light, a visible light, or an infrared light that has a wavelength to which the photoresist is not sensitive may be used. In the case where an infrared light is used, since the liquid (water) absorbs the infrared light and thus by the use of the infrared light, the light receiving conditions of light receiving system 92 significantly changes, it can be detected with high accuracy whether liquid LQ is adhering on substrate P.

As described above, liquid LQ of the embodiments is constituted by purified water. Purified water has the advantage that it is easily available in bulk in, e.g., semiconductor manufacturing factories and also the advantage that it does not adversely affect photoresist on substrate P, optical elements (lenses), etc. Further, purified water does not adversely affect the environment and contains scarcely any impurities; thus, the effect that it cleans the surface of substrate P and the surface of the optical element provided at the end portion of projection optical system PL can be expected.

Further, the refractive index n of purified water (water) relative to exposure light EL having a wavelength of about 193 nm is said to be approximately 1.44, and thus, when ArF excimer laser light (having 193 nm wavelength) is used as the light source of exposure light EL, the wavelength is effectively shortened, on substrate P, as multiplied by 1/n, i.e., effectively becomes approximately 134 nm, and a high resolution can be obtained. Further, since the depth of focus increases by approximately n times, i.e., approximately by 1.44 times, compared with that in the air, when securing of the depth of focus on par with the depth of focus realized when the projection optical system is used in the air suffices, the numerical aperture of the projection optical system PL can be further increased, which also improves the resolution.

While, in the embodiment, lens 2 is attached to the end portion of projection optical system PL, an optical plate for adjusting the optical characteristics, e.g., aberrations (spherical aberration, coma aberration, etc.), of projection optical system PL may be utilized as the optical element to be attached to the end portion of projection optical system PL. Alternatively, a plane parallel plate that can transmit exposure light EL may be utilized.

It should be noted that if the pressure, caused by the flow of liquid LQ, of the space between the optical element located at the end portion of projection optical system PL and substrate P is high, it may be configured such that the optical element is rigidly fixed so as not to move due to the pressure, instead of making the optical element replaceable.

It should be noted that while, in the embodiment, it is configured such that the space between projection optical system PL and the surface of substrate P is filled with liquid LQ, it may also be configured, for example, such that the space is filled with liquid LQ in the condition that a cover glass constituted by a plane parallel plate is attached to the surface of substrate P.

It should be noted that while, in the embodiments, liquid LQ is water, liquid LQ may be a liquid other than water. For example, when the light source of exposure light EL is an $F_2$ laser, the $F_2$ laser light does not transmit through water, and thus, as liquid LQ, a fluorofluid that can transmit the $F_2$ laser light, such as perfluoropolyether (PFPE) or fluorochemical oil, may be used. Further, as liquid LQ, a material (e.g., cedar oil) that can transmit exposure light EL, has a high refractive index as high as practicable, and does not affect projection optical system PL and the photoresist applied to the surface of substrate P can also be used.

It is to be noted that as the substrate P of each of the above-described embodiments, not only a semiconductor wafer for manufacturing a semiconductor device, but also a glass substrate for a display device, a ceramic wafer for a thin film magnetic head, a master mask or reticle (synthetic quartz or silicon wafer), etc. can be used.

Further, while, in the above-described embodiment, the exposure apparatus in which the space between projection optical system PL and substrate P is locally filled with the liquid, the present invention can also be applied to such a liquid immersion exposure apparatus, as disclosed in Japanese Unexamined Patent Publication Hei 6-124873, in which a stage holding a substrate to be exposed is made to move in a liquid bath and to such a liquid immersion exposure apparatus, as disclosed in Japanese Unexamined Patent Publication Hei 10-303114, in which a liquid bath having a predetermined depth is formed on a stage, and a substrate is held the liquid bath.

As the exposure apparatus (exposure apparatus main body) EX, in addition to a scan type exposure apparatus (scanning stepper) in which while synchronously moving mask M and substrate P, the pattern of mask M is scan-exposed, a step-and-repeat type projection exposure apparatus (stepper) in which the pattern of mask M is exposed at one time in the condition that mask M and substrate P are stationary, and substrate P is successively moved stepwise can be used. Also, the present invention can be applied to a step-and-stitch type exposure apparatus in which at least two patterns are transferred onto substrate P in a partially overlapping manner.

As the type of exposure apparatus EX, the present invention is not limited to an exposure apparatus, which exposes a semiconductor pattern onto substrate P, for manufacturing semiconductor devices, but can also be applied to a variety of exposure apparatuses, e.g., an exposure apparatus for manufacturing liquid crystal display devices or displays, an exposure apparatus for manufacturing thin film magnetic heads, an exposure apparatus for manufacturing image pickup devices, and an exposure apparatus for manufacturing reticles or masks.

When using a linear motor (see U.S. Pat. No. 5,623,853 or U.S. Pat. No. 5,528,118) in substrate stage PST and/or mask stage MST, either air-cushion type linear motor using an air bearing or a magnetic levitation type linear motor using a Lorentz force or reactance force may be used. Further, each of substrate stage PST and mask stage MST may be either of a type moving along a guide or of a guideless type having no guide.

As the driving mechanism for each of substrate stage PST and mask stage MST, a planar motor in which by making a magnet unit in which magnets are two-dimensionally arranged and an armature unit in which coils are two-dimensionally arranged face each other, each of substrate stage PST and mask stage MST is driven by an electromagnetic force may be used. In this case, either one of the magnet unit and the armature unit is attached to stage PST or stage MST, and the other unit is attached to the moving surface side of stage PST or stage MST.

A reaction force generated by the movement of substrate stage PST may be, as described in Japanese Unexamined Patent Publication Hei 8-166475 (U.S. Pat. No. 5,528,118), mechanically released to the floor (earth) by use of a frame member so that the force does not transmit to projection optical system PL. A reaction force generated by the movement of mask stage MST may be, as described in Japanese Unexamined Patent Publication Hei 8-330224 (U.S. patent application Ser. No. 08/416,558), mechanically released to the floor (earth) by use of a frame member so that the force does not transmit to projection optical system PL.

As described above, exposure apparatus EX according to the embodiments of the present application is built by assembling various subsystems, including each element listed in the claims of the present application, in such a manner that prescribed mechanical accuracy, electrical accuracy, and optical accuracy are maintained. In order to ensure the various accuracies, prior to and after the assembly, every optical system is adjusted to achieve its optical accuracy, every mechanical system is adjusted to achieve its mechanical accuracy, and every electrical system is adjusted to achieve its electrical accuracy. The process of assembling each subsystem into the exposure apparatus includes mechanical interfaces, electrical circuit wiring connections, and air pressure plumbing connections between each subsystem. Needless to say, there is also a process where each subsystem is assembled prior to the assembling of the exposure apparatus from the various subsystems. On completion of the process of assembling the various subsystems in the exposure apparatus, overall adjustment is performed to make sure that various accuracies of the complete exposure apparatus are achieved. Additionally, it is desirable to manufacture the exposure apparatus in a clean room, in which the temperature, purity, etc. are controlled.

Figure 10:
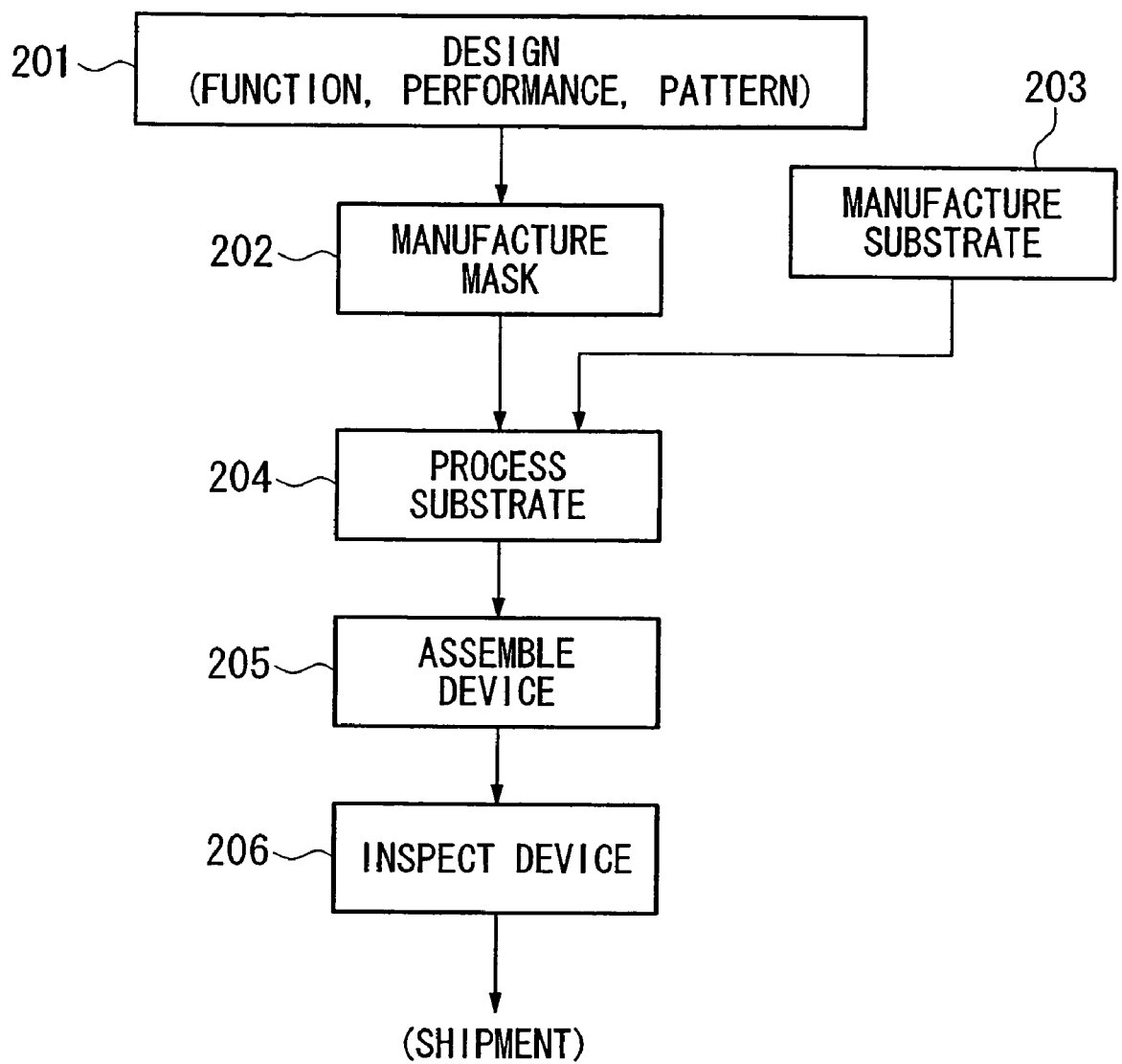
FIG. 10 a flowchart showing an example of a semiconductor device manufacturing process.

As shown in FIG. 10, microdevices such as semiconductor devices are manufactured by a series of steps, including: step 201 in which the micro device's function and performance design is performed; step 202 in which a mask (reticle) is manufactured based on the design step; step 203 in which a substrate, the device's base material, is manufactured; step 204 in which the mask pattern is exposed onto the substrate by exposure apparatus EX according to the above-described embodiments; device assembly step 205 (including the dicing process, bonding process, and packaging process); inspection step 206.

What is claimed is:
1. A lithographic projection apparatus comprising:
a substrate table by which a substrate is held;
a projection system via which a patterned beam of radiation is projected onto the substrate to produce an exposed substrate;
a liquid supply system by which liquid is supplied to a space between the projection system and the substrate; and
a residual liquid detector that detects liquid remaining on the exposed substrate after an exposure is completed and before the exposed substrate is developed and before the exposed substrate is held on a holding table other than the substrate table, wherein
the residual liquid detector performs liquid detection on a way to the holding table while the substrate is moving relative to the residual liquid detector.
2. The apparatus according to claim 1, further comprising a drying station that holds the exposed substrate on the holding table and dries the exposed substrate in the event that liquid is detected by the residual liquid detector.
3. The apparatus according to claim 1, wherein the residual liquid detector comprises one or more devices selected from the group comprising a camera, an infrared sensor, and a detector to detect scattered light.
4. The apparatus according to claim 1, wherein the projection system is provided at an exposure station and the residual liquid detector is provided at a measurement station, the measurement station being separate from the exposure station.

5. The apparatus according to claim 1, wherein the residual liquid detector generates, upon detection of residual liquid, a signal to instruct performance of a drying action.

6. The apparatus according to claim 1, wherein the residual liquid detector detects liquid remaining on the exposed substrate after the exposed substrate is moved from under the projection system.

7. The apparatus according to claim 6, wherein the residual liquid detector detects liquid remaining on the exposed substrate after the exposed substrate is unloaded from the substrate table.

8. The apparatus according to claim 1, further comprising a liquid recovery system by which liquid is recovered from the space between the projection system and the substrate, wherein the space between the projection system and the substrate is locally filled with liquid by the liquid supply system and the liquid recovery system with the patterned beam being projected onto the substrate.

9. The apparatus according to claim 1, wherein if the liquid is not detected by the residual liquid detector, the exposed substrate does not enter a drying station.

10. A device manufacturing method comprising projecting, using a projection system of a lithographic apparatus, a patterned beam of radiation through a liquid onto a substrate to produce an exposed substrate, the substrate being held by a substrate table, and, after the projecting is complete and before the exposed substrate is developed and before the exposed substrate is held on a holding table other than the substrate table, detecting residual liquid on the exposed substrate in the lithographic apparatus, wherein the detecting residual liquid is performed by the residual liquid detector on a way to the holding table while the substrate is moving relative to the residual liquid detector.

11. The method according to claim 10, further comprising drying the exposed substrate in the event that residual liquid is detected.

12. The method according to claim 10, wherein detecting residual liquid is performed by one or more devices selected from the group comprising a camera, an infrared sensor, and a detector to detect scattered light.

13. The method according to claim 10, wherein projecting the patterned beam of radiation is performed at an exposure station and detecting residual liquid is performed at a measurement station, the measurement station being separate from the exposure station.

14. The method according to claim 10, wherein in the lithographic apparatus, detecting residual liquid on the exposed substrate is performed after the exposed substrate is moved from under the projection system.

15. The method according to claim 14, wherein in the lithographic apparatus, detecting residual liquid on the exposed substrate is performed after the exposed substrate is unloaded from the substrate table.

16. The method according to claim 10, further comprising:
locally filling a space between the projection system and the substrate with liquid by supplying liquid to the space and by recovering liquid from the space with the patterned beam being projected onto the substrate.

17. The method according to claim 10, wherein if the residual liquid is not detected, the exposed substrate does not enter a drying station.

* * * * *